United States Patent [19]
Mader et al.

[11] Patent Number: 5,129,722
[45] Date of Patent: Jul. 14, 1992

[54] EXPANSION WINDOWING SYSTEM FOR A MEASUREMENT TEST INSTRUMENT

[75] Inventors: Josef L. Mader; Richard I. Lane, both of Bend, Oreg.; Ronald J. Bremer, Vancouver, Wash.; Matthew Harcourt, Bend; Glenn Bateman, Powell Butte, both of Oreg.

[73] Assignee: Tektronix, Inc., Beaverton, Oreg.

[21] Appl. No.: 701,548

[22] Filed: May 16, 1991

[51] Int. Cl.$^5$ .................... G01N 21/88; G01R 13/30
[52] U.S. Cl. .................... 356/73.1; 340/709
[58] Field of Search .................... 356/73.1; 340/709

[56] References Cited

U.S. PATENT DOCUMENTS 4,898,463 2/1990 Sakamoto et al. .................... 356/73.1

Primary Examiner—Vincent P. McGraw
Attorney, Agent, or Firm—William K. Bucher

[57] ABSTRACT

A system for expanding a waveform in a measurement test instrument has a display area containing a waveform representative of data acquired by a measurement test instrument and an active movable cursor intersecting the waveform. The system has first and second viewports with the first viewport displaying the waveform in the display area and the second viewport displaying a portion of the waveform from the first viewport in an expanded form when the second viewport is in the display area. The second viewport has a center point and dimensions defined in the first viewport with the center point being defined by the intersection of the active movable cursor with the waveform and the dimensions being defined with respect with the center point. The second viewport is movable within the first viewport as a function of movement of the cursor. Means are provided for varying the dimensions of the second viewport about the cursor/waveform intersection when the first viewport is in the display area and for further expanding the waveform in a continuous manner about the cursor/waveform intersection when the second viewport is in the display area. Means are provided for replacing the first viewport with the second viewport in the display area.

6 Claims, 22 Drawing Sheets

EXPANSION WINDOWING SYSTEM FOR A MEASUREMENT TEST INSTRUMENT

The present invention relates to measurement test instruments for displaying waveform data and more particularly to an expansion windowing system for displaying the waveform data in an expanded form in an optical time domain reflectometer having multiple viewports.

BACKGROUND OF THE INVENTION

Measurement test instruments, such as oscilloscopes, logic analyzers, optical time domain reflectometers, and the like, are increasingly using microprocessor and raster scan display technology to provide users with greater measurement capabilities and ease of use. One feature that is useful in measurement test instruments is the ability to expand a portion of a displayed waveform to see details that are not easily discernable in the waveform. Waveform expansion is accomplished in current optical time domain reflectometers by incrementing the horizontal and vertical scales on the display by set amounts. For example, the OF235 Optical Time Domain Reflectometer, manufactured and sold by Tektronix, Inc., Beaverton, Oreg., has a horizontal scale in distance/division that ranges from 5000 meters to 5 meters per division in a 5-2-1 sequence. The vertical scale is in dB/division with scale setting of 5 dB, 1 dB and 0.25 dB per division. Decreasing the distance/division and/or the dB/division setting has the effect of expanding the waveform in the display. In operation, a movable distance cursor is positioned on the waveform at a location where an operator wishes to expand the waveform. Changing the distance/division setting automatically repositions the distance cursor and its associated waveform point as close as possible to the center of the screen while effectively expanding the waveform as a function of the distance/division setting.

Expanding portions of a display have also been successfully used in the graphic display terminals and computer workstations where images, such as maps, mechanical parts, integrated circuit and circuit board layouts, and the like, are displayed on a cathode ray tube or the like. U.S. Pat. No. 4,532,605 entitled "True Zoom of a Displayed Image" describes an apparatus and method for use with a graphic display terminal where a particular region of a displayed image in the display is defined and expanded while maintaining the width of the lines of the zoomed image regardless of the degree or amount of magnification of the zoomed image. The zoom function is initiated by a user hitting a zoom key on the terminal keyboard and rotating thumb wheels to vary the vertical and horizontal size of a box defining the zoom region. The initial size of the box is equal to the full screen display and its center point is set to the center of the display. Once the size of the zoom region is defined in the horizontal and vertical dimensions, the user hits a pan key which displays cross-hair cursor at the center of the defined zoom region and allows movement of the region over the display. After the region is positioned at the desired location, the user hits a view key, which expands the zoom region to fill the screen.

U.S. Pat. No. 4,812,996 entitled "Signal Instrumentation Control System" describes the use of a computer to control a programmable test instrument, such as a digitizer, for displaying data acquired from the test instrument on the computer display. The system is interactive in that once the data is acquired from the test instrument and displayed, the user may define a smaller region on the display for further examination. The computer keyboard or mouse is used to move a cross-hair cursor over the display for defining diagonal corners of the region that is to be re-examined. Software in the computer translates the defined corners of the region from the display coordinates of the computer to test instrument parameters, such a sample interval, delay, and vertical range, and transmits these parameters to re-program the instrument. The test instrument acquires the new data at the new parameters setting and passes the data back to the computer, which translates the data into screen coordinates and displays the newly acquired data with the appropriate scale settings.

Each of the above described systems for expanding waveform or image data on a display has drawbacks. Expanding a waveform as a function of predefined horizontal division settings limits the amount of waveform expansion to the defined settings. In addition, expansion of the waveform is sequential requiring an operator to take the time to decrement through the distance/division settings in order to expand the waveform. Graphic display terminal pan and zoom expansion has a similar drawback to the incremental horizontal distance settings in that only one expansion can be performed using the defined expansion window. A new window must be defined and positioned on the display in order to perform additional expansion. Similarly, the computer controlled programmable test instrument requires the redefining of the expansion window and the reacquisition of data for each new window.

What is needed is a system for expanding a waveform in a display area of a measurement test instrument, such as an optical time domain reflectometer, where an expansion window is definable relative to the waveform in the display area and where that portion of the waveform being defined by the expansion window is displayable in an expanded form in the display area with the expanded waveform being further expandable in the display area in a continuous manner.

SUMMARY OF THE INVENTION

Accordingly the present invention is a system for expanding a waveform in a display area having an active movable cursor intersecting the waveform with the waveform representative of data acquired by a measurement test instrument. The system has first and second viewports with the first viewport for displaying the waveform in the display area. The second viewport displays a portion of the waveform from the first viewport in an expanded form when the second viewport is in the display area. The second viewport has a center point and dimensions defined within the first viewport with the center point being defined by the intersection of the active movable cursor with the waveform and the dimensions being defined with respect with the center point. The second viewport is movable within the first viewport as a function of movement of the cursor. Means are provided for varying the dimensions of the second viewport about the cursor/waveform intersection when the first viewport is in the display area and for further expanding the waveform in a continuous manner about the cursor when the second viewport is in the display area. Means are provided for replacing the first viewport with the second viewport in the display area. The objects, advantages and novel features of the present invention are apparent from the following de-

DETAILED DESCRIPTION OF THE PREFERRED EMBODIMENT

Figure 1:
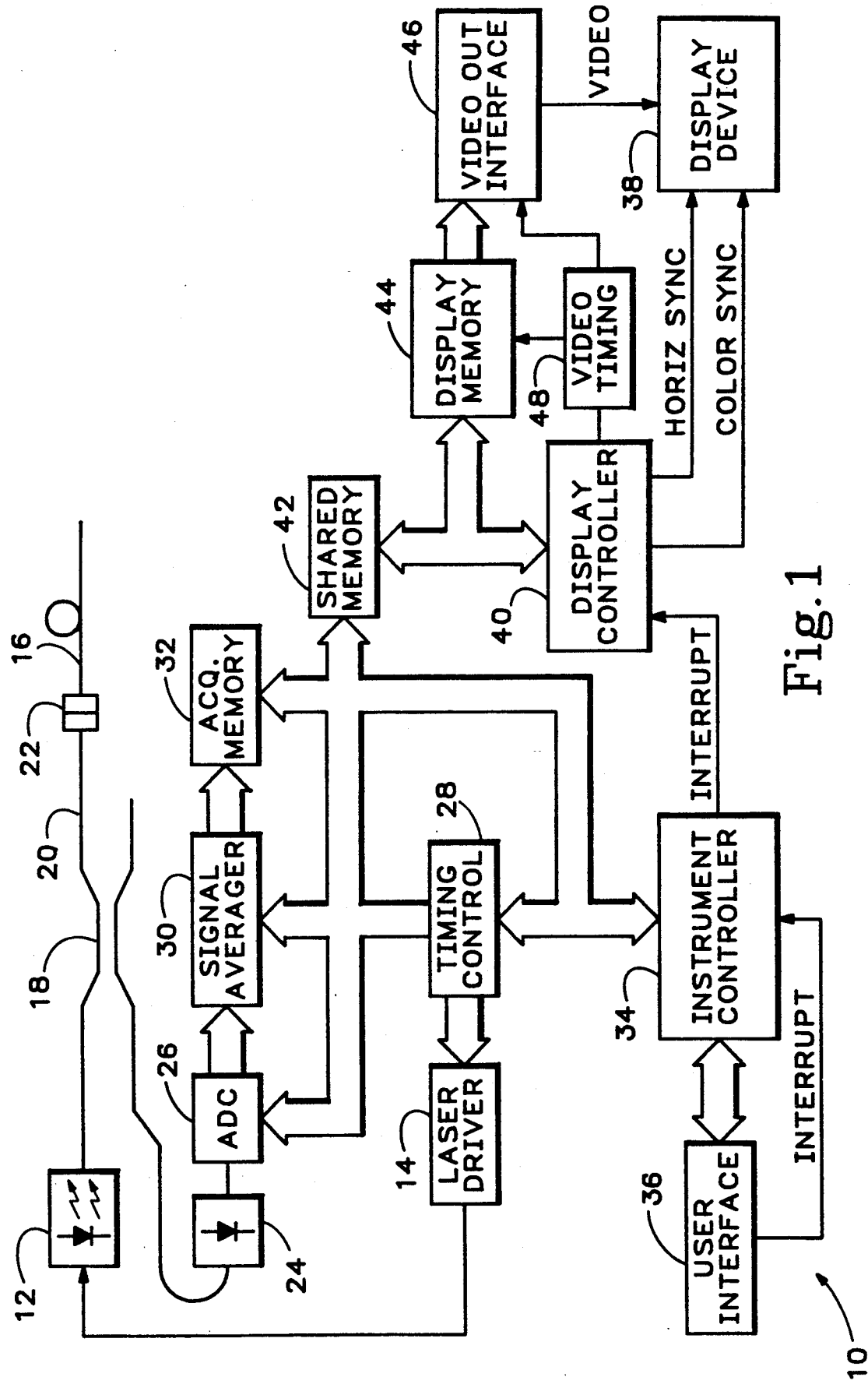
FIG. 1 is a block diagram of an optical time domain reflectometer having the system for expanding a waveform according to the present invention.

Referring to FIG. 1 there is shown a block diagram of an optical time domain reflectometer, OTDR, 10 using the system for expanding a waveform according to the present invention. The OTDR comprises a laser diode 12 that is energized intermittently by a laser driver 14 to launch interrogating pulses into a fiber 16 by the way of a directional coupler 18 and a launch fiber 20, which is connected to fiber 16 by a connector 22. OTDR 10 receives return light from fiber 16 due to Rayleigh backscattering and Fresnel reflections. The intensity of the backscattered and reflected light depends on the condition of the fiber under test 16.

A portion of the return light received from fiber 16 is coupled through coupler 18 to a photodetector 24, which generates a current signal representative of the intensity of the return light. The current signal is converted to a voltage signal and the voltage signal is amplified by a transimpedance amplifier (not shown). The amplified voltage signal is sampled and converted to a digital form by analog-to-digital converter (ADC) 26. A timing controller 28 controls the timing of the ADC 26 relative to the laser driver 14. The timing controller 28 also has an address generator for providing addresses to a signal averager 30 and an acquisition memory 32. The timing controller and the address generator are respectively described in U.S. Pat. No. 4,982,387, issued on Jan. 1, 1991 to William A. Trent and entitled "Digital Time Base with Differential Period Delay", and co-pending U.S. patent application entitled "Address Generator for High Speed Data Averager", to William A. Trent and Mark Marineau, application Ser. No. 07/428,534, filed Oct. 30, 1989, both assigned to the assignee of the instant application. The digital data values from the ADC 26 representative of the light intensity at selected points in the fiber 16 are passed to the signal averager 30, which accumulates and averages the digital values as a function of repetitive interrogations of the fiber 16. The averaged data values are written into the acquisition memory 32 for eventual transfer to shared memory 42. The acquisition memory 32 is divided into a standard acquisition memory and a high density acquisition memory. The most significant bit in the memory address, which is provided by instrument controller 34, determines which memory is used to store the digital data from the signal averager 30. A description and use of the acquisition memory is described in co-pending U.S. patent application entitled "Test and Measurement Instrument With Digital Storage", to Richard Lane et al, application Ser. No. 07/514,396, filed Apr. 25, 1990 and assigned to the assignee of the instant application. The instrument controller 34 computes the data acquisition parameters for the timing controller 28 and the signal averager 30 from the current instrument state.

The display device 38 comprises a cathode ray tube or other device having a rectangular array display area of 640×480 addressable pixels that is controlled by a display controller 40. Waveform data from the acquisition memory 32 and user interface 36 settings are received by the display controller 40 from the instrument controller 34 via a shared memory 42. The waveform data from the acquisition memory 32 is stored in an array defined in a MeasuredWaveform object. Objects will be discussed in greater detail below. The display controller 40 scales and formats waveform data to reflect the user interface 36 settings and places the formatted waveform and associated measurement text into display memory 44 for display on display device 38. Any changes from the user interface 36 received by the display controller 40 via the instrument controller 34 may require the display controller 40 to rescale or reformat the previous received waveform or to move cursors in the display area.

The display memory 44 is a 1024×1024×4 bit array frame buffer that can hold two video frames of information. The information in the display memory 44 is read into a video output interface 46 that provides a lookup table and video digital-to-analog converter (DAC). The output of the DAC is a TTL-compatible signal capable of driving the video data output to the display device 38. The display controller 40 provides horizontal and color sync pulses to the display device 38. Timing synchronization for the display section, including the controller 40, memory 44 and interface 46 is provided by a video timing 48 clock signal.

Figure 2:
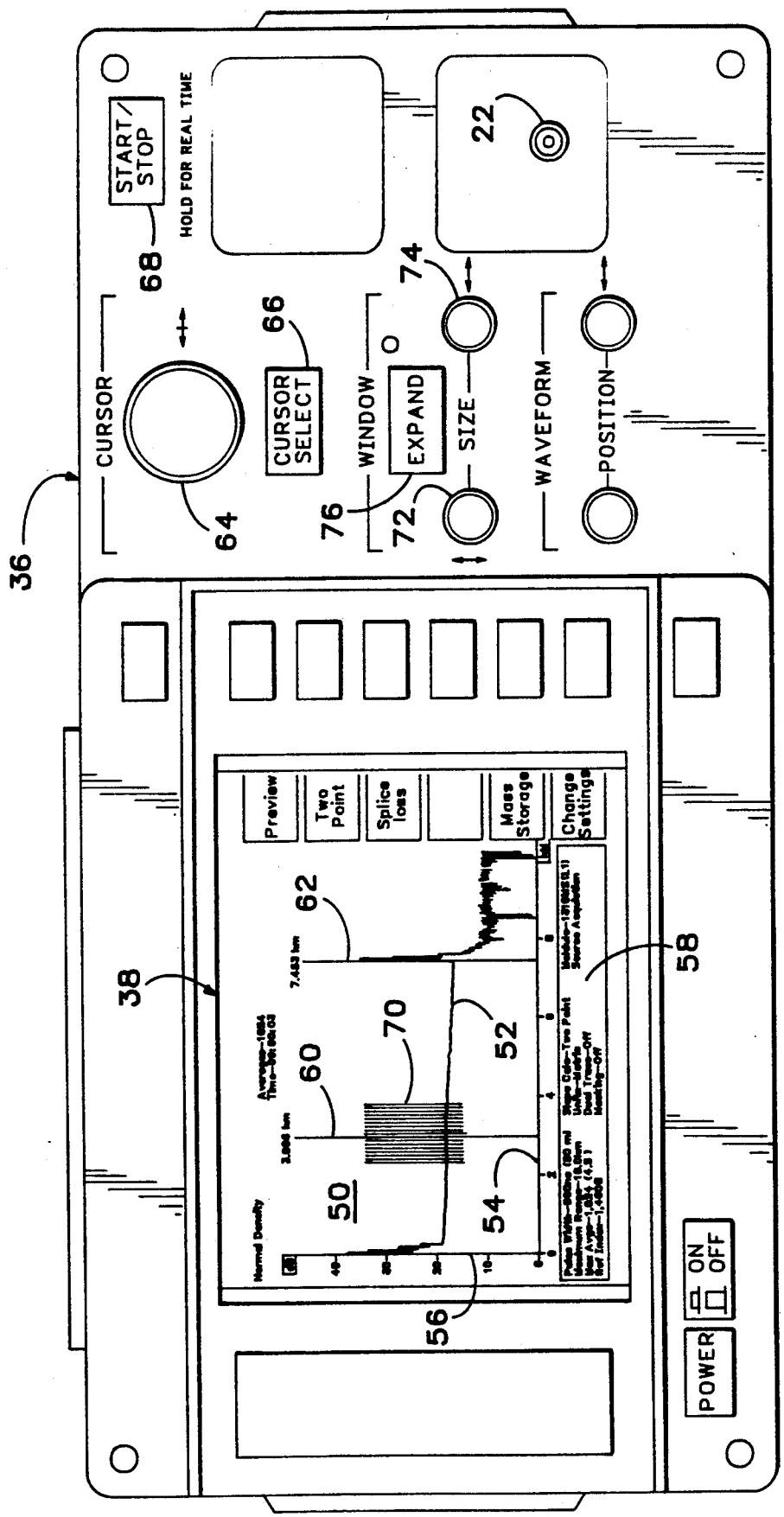
FIG. 2 is first view of the user interface of an OTDR showing a first viewport according to the system for expanding a waveform of the present invention.

Referring to FIG. 2, there is shown the user interface 36 of the OTDR 10 having front panel controls 64-68, 72-76 and the CRT of the display device 38. The user interface 36 may include additional switches and knobs that are used in conjunction with screen displays in the display area 50 for setting operating parameters for the OTDR, such as the pulse width of the launched interrogation pulse, the index of refraction of the test fiber, maximum testing range, maximum number of averages, and the like. The additional switches and knobs may also be used for making measurements and moving the waveform 52 within the display area 50. The CRT of display device 38 has a display area 50 that is divided into a 640×480 pixel array. This array corresponds to one video frame in the display memory 44. The display area 50 shows a waveform 52 representative of the acquired data from the acquisition circuits of the OTDR. Horizontal and vertical scales, respectively numbered 54 and 56 are provided as well as an area 58 for displaying information concerning the instrument set up. Additional information relating to measurement values, distances and the like may be displayed at various locations in the display. Cursors 60 and 62 are provided with cursor 60 being an active movable cursor and cursor 62 being an inactive stationary cursor.

Figure 3:
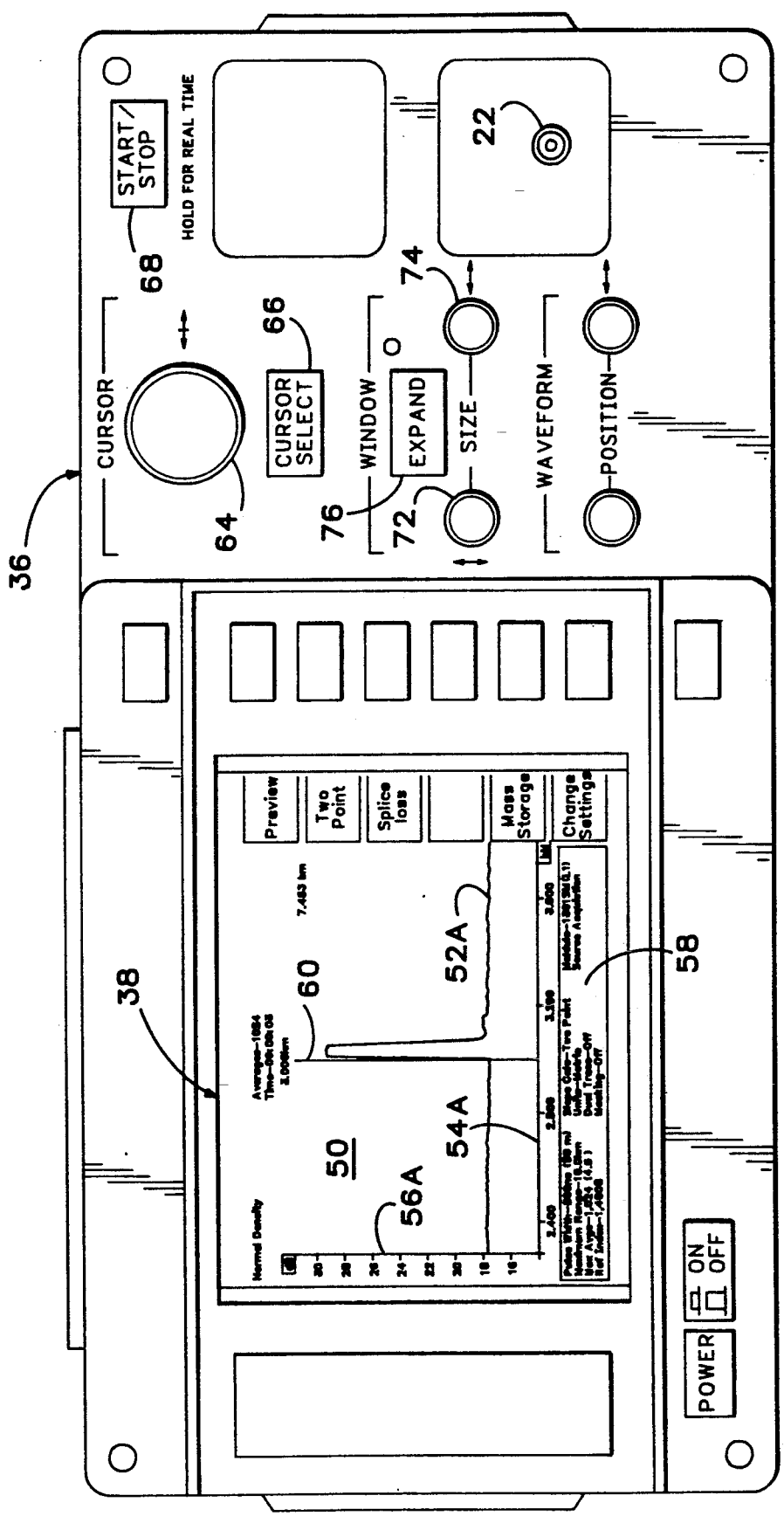
FIG. 3 is second view of the user interface of an OTDR showing a second viewport with an expanded waveform according to the system for expanding a waveform according to the present invention.

The front panel controls include a cursor control knob 64 for controlling the position of the active movable cursor 60 in the display area 50. The cursor select switch 66 controls which cursor is the active cursor and which is the inactive cursor. Activating the cursor select switch 66 makes the inactive cursor 62 the active cursor and the active cursor 60 the inactive cursor. A start/stop switch 68 activates the laser and acquisition hardware for launching interrogation pulses into the fiber 16 and for acquiring the data representative of the return light from the fiber 16. Front panel connector 22 connects the test fiber 16 to the OTDR. The display area 50 also shows an expansion window 70. The dimensions of the expansion window 70 are controlled by vertical and horizontal expansion window size control knobs 72 and 74 respectively. An expand switch 76 is used for replacing an overview display containing the waveform 52 with an expanded display defined by the expansion window 70 and containing an expanded waveform 52A as is shown in FIG. 3. The same reference numerals as used in FIG. 2 are used to denote like elements in FIG. 3. The display area 50 shows a portion of the waveform 52 defined by the expansion window 70 in FIG. 2 as 52A with the expansion window 70 filling the display area 50. The horizontal and vertical scales, 54A and 56A, have been changed to reflect the size and the position of the expansion window 70 in the originally scaled display area 50. Turning the window size knobs 72 and 74 while the expansion window 70 fills the display area 50 causes the waveform to expand further in the display area 50.

The expansion windowing system of the present invention is implemented as part of an overall software control system for a measurement test instrument that is designed using object oriented programming (OOP). Object oriented programming is different from traditional programming in that it introduces the concept of combining data and procedures into groupings called objects. Each object belongs to a class, which may be viewed as providing a template into which data is stored and the procedures for accessing and manipulating the object's data to produce some result. An object in a class is referred to as an instance of a class that contains specific data. An object is a single entity containing data and the procedures operating on the data and cannot be thought of as a separate data structure, such as an array, and separate procedures working on that data structure as in traditional programming languages. The behavior of an object is defined by the procedures that are available to the object. OOP also introduces a concept called inheritance where a subclass, derived from a base class, inherits the data and functional capabilities of the base class. Inheritance arises from the fact that objects consist of both data and the functions that operate on the data. For example, a data base system may be designed that contains information on customers, suppliers and employees. Common information on customers, suppliers and employees, such as name and address, are defined in a first class, which has associated procedures that operate on the data contained in the class. Specific information related to customers, suppliers and employees, such as type and quantity of product ordered, type and quantity of product supplied and employee ID number, are defined in separate subclasses derived from the base class. Each separate subclass inherits the data template and functional capabilities of the base class containing the names and addresses. Therefore, the data template for the customer subclass contains the fields for the customer information on type and quantity of product ordered and inherits fields for the name and address of the customer from the base class it was derived from. Additional subclasses may be defined from an existing subclass with any new subclass inheriting all of the data and functional capability from the classes in the hierarchy. Inheritance is a useful feature in implementing OOP but it is not necessary. An OOP system may be designed with independent objects that do not inherit behaviors from other objects. Another important concept in OOP languages, such as Smalltalk 80, C++, and the like, is that an object cannot operate directly on another object without circumventing the interface defined for the object. To get data or a result from another object, it normally requires a message to be sent from a requesting object, requesting the information, and a requested object performs the necessary procedure to retrieve the information and pass it back to the requesting object.

Figure 4:
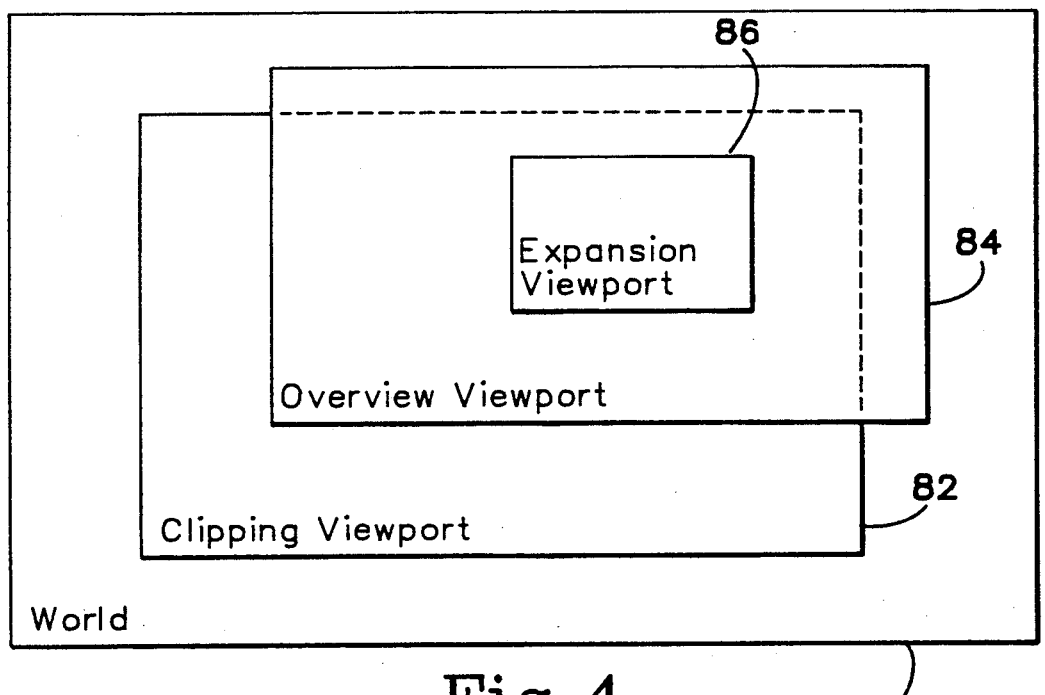
FIG. 4 is a representation of the coordinate system for defining dimensions in the viewports of the system for expanding a waveform according to the present invention.

Referring to FIG. 4, there is shown a representation of various viewports of the expansion windowing system of the present invention. A viewport object is defined which specifies the area enclosed by the viewport in terms of world coordinates 80. The world coordinates 80 are in dB's in the vertical direction and in distance (km or kft) in the horizontal direction. As implemented in the preferred embodiment, the vertical and horizontal dimensions are stored as integers with the dB's stored as waveform counts representing the output of the acquisition hardware, and the distances are scaled and stored in units of 500 microns. The viewport object maintains the minimum and maximum amplitudes and distances (the left, right, bottom and top edges) of the area covered by the viewport, and includes routines for manipulating the viewport, such as changing the width or the height, or shifting the viewport in either direction.

A clipping viewport 82 defines the boundaries for cursors 60 and 62 and overview and expansion viewports, respectively numbered 84 and 86. Cursors 60 and 62 are confined to this area and the overview and the expansion viewports, 84 and 86, are confined such that their centers must remain within this area. In the preferred embodiment, the minimum and maximum amplitudes of the clipping viewport 82 remained fixed at $-20$ and 50 dB. The right edge of the clipping viewport 82 varies with the maximum range setting as selected by the user, which controls the pulse repetition rate of the acquisition hardware and defines the farthest point on the test fiber 16 for which data can be acquired. The left edge of the clipping viewport 82 is set to the lesser of 0 km or the distance at the left edge of the waveform being displayed.

The overview viewport 84 defines the area that is viewed in the display area 50 in the overview mode. The height of the overview viewport is defined by the dynamic range of the acquisition hardware. The width is set to enclose the entire range of the acquisition, which varies with changes in the maximum range setting. The expansion viewport 86 defines the area that is viewed in the display area 50 when the waveform 52 is expanded. The width and the height of the expansion viewport 86 may be changed using the window size knobs 72 and 74.

In the present invention, either the overview viewport 84 or the expansion viewport 86 will be active in the display area 50 at all times. Moving the active cursor past the display area 50 but within the area defined by the clipping window 82 causes the active viewport to shift to keep up with the cursor 60. From a user's perspective this appears as though the active cursor is dragging the active viewport along with it and shifting the waveforms 52 or 52A in the opposite direction. As was previously stated, the cursor select switch 66 controls which of the two cursors 60 and 62 is active in the display area 50. Activating the cursor select switch 66 causes the active viewport to shift horizontally so that the new active cursor is in the display area 50 unless the newly activated cursor is already visible within the display area 50 of the active viewport. In instances where the vertical position of the active viewport does not contain any data at the new horizontally shifted position, the viewport is shifted vertically far enough to enclose part of the waveform data. With the overview viewport 84 active in the display area 50, switching active cursors causes the expansion window 70 to shift to the active cursor.

When the overview viewport 84 is the active viewport in the display area 50, the expansion viewport 86 is displayed as the expansion window 70 and is positioned horizontally by moving the active cursor 60. The expansion window 70 moves both vertically and horizontally in response to the active cursor 60 so that it remains centered around the intersection of the cursor 60 with the waveform 52. The expansion window 70 is resizable in both the vertical and horizontal dimensions about the intersection center point using the expansion window size control knobs 72 and 74. It is understood that moving or manipulating the expansion window 70 within the overview viewport 84 has a corresponding effect on the expansion viewport 86.

Activating the expand switch 76 replaces the current active viewport in the display area 50 with the non-active viewport. For example, with the overview viewport 84 being the active viewport in the display are 50, activating the expand switch 76 causes the area defined by the expansion window 70 to fill the display area 50, i.e. the expansion viewport 86 becomes the active viewport. Activating the expand switch 76 again, replaces the expansion viewport 86 in the display area 50 with the overview viewport 84. With the expansion viewport 86 in the display area 50, the waveform 52A may be further expanded or contracted in both the vertical and horizontal dimensions by using the expansion window size control knobs 72 and 74. The zooming in and out on the waveform 52A is caused, in effect, by changing the dimensions of the expansion viewport 86. While in the expand mode, switching active cursors causes the expansion viewport to shift to the newly active cursor unless the newly activated cursor is already visible within the display area 50 of the expansion viewport.

The cursors 60 and 62, waveforms 52 and 52A, the expansion window 70, and the viewports 84 and 86 are manipulated primarily by activating switches and turning knobs on the user interface 36. Each time a switch is activated or a knob is turned, low-level user interface software generates a system event which specifies the switch activated or which knob is turned, the direction it is turned, and the number of clicks it is turned. In order to manipulate the viewports, these event clicks must be interpreted as some sort of change that is to take place on the viewport. By turning a knob one click in either direction, it is assumed that the user is trying to produce the smallest possible visible change in the display area 50. In most cases the smallest visible change is one pixel. Therefore the knob click must be interpreted as a pixel, and translated into world coordinates (dB's or distance). This change in amplitude or distance is applied to the appropriate object (a cursor or viewport or both).

Once the viewport information has been changed, it is displayed in the display area 50 of the display device 38 by the dedicated display controller 40. The display controller 40 translates the distance and amplitude information into pixels. At the interface to the controller 40 objects are defined, which specify the objects which appear in the display area 50, such as text, the horizontal and vertical axis, cursors, and the waveform. The waveform object is set up to specify, in pixels, the physical location in the display area 50 where the waveform is to be displayed. Other fields are then used to specify how the waveform should be displayed within that portion of the display area 50. These other fields are used to map the world coordinates to display coordinates by specifying which amplitudes in waveform counts are to be mapped to the top and bottom edges, and which distances in waveform indexes are to be mapped to the left and right edges of the display area 50 in which the waveform is to appear. Waveforms are a series of samples, so the sample number or waveform index may also be thought of as a distance unit whose scale changes with sample density, i.e. the sample density may be used to translate between waveform indexes and distances.

Figure 5:
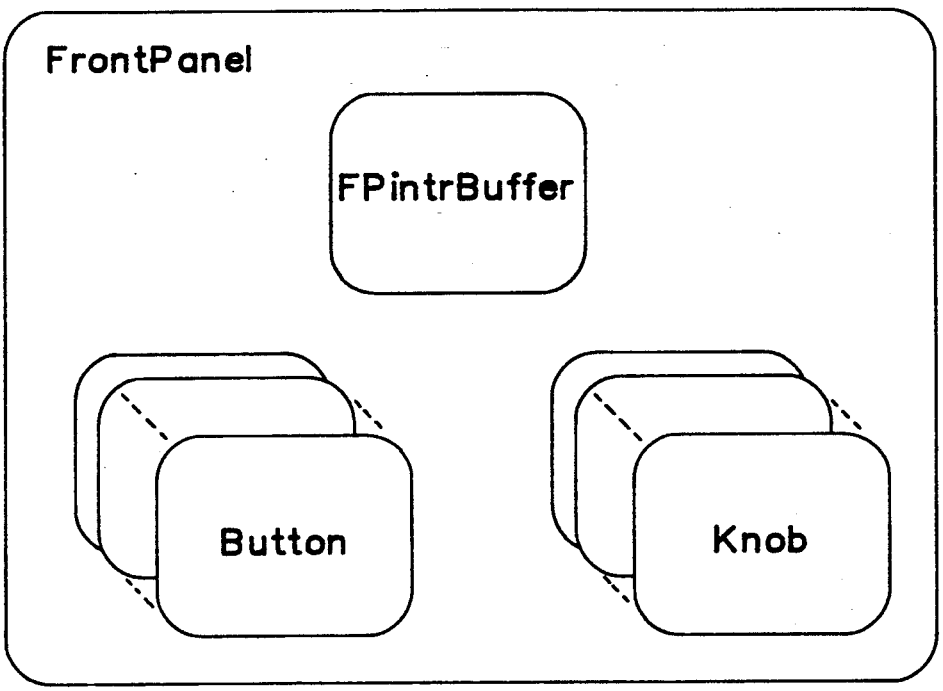
FIGS. 5-7 illustrate the organization of software objects in the system for expanding a waveform according to the present invention.
Figure 6:
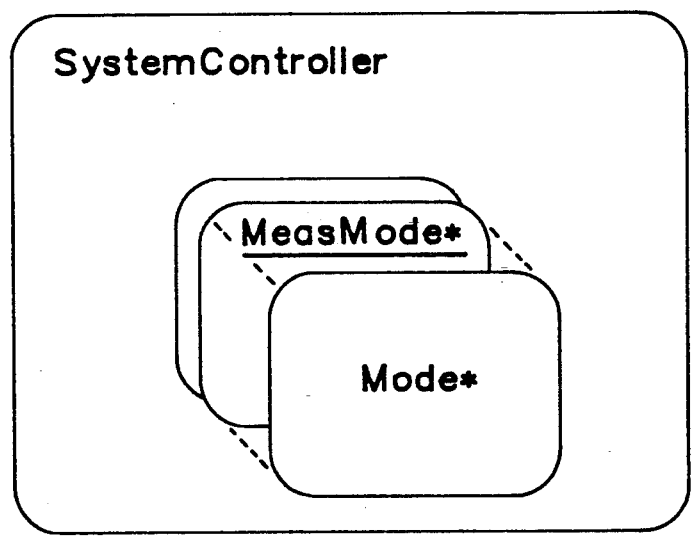
Figure 7:
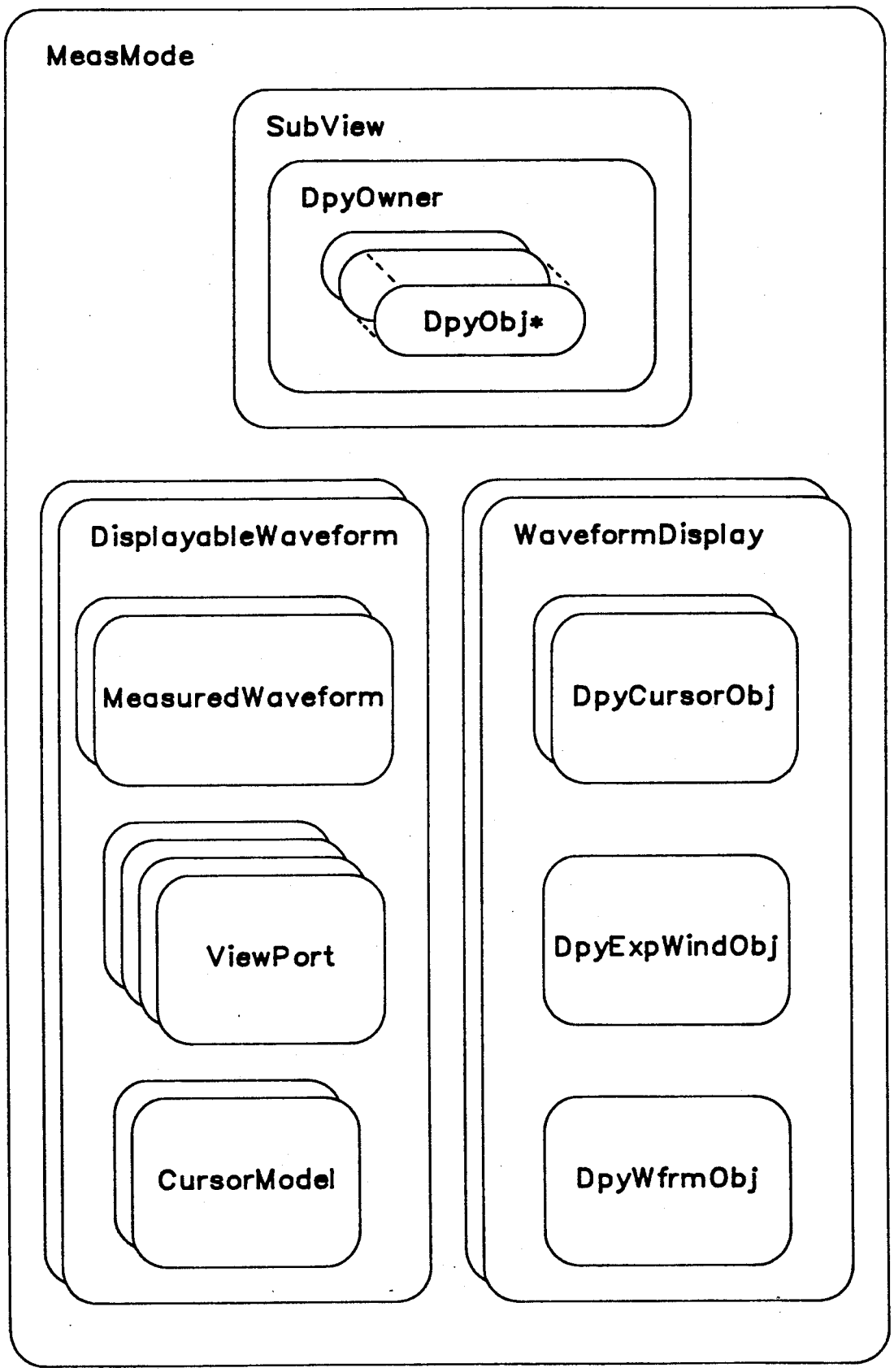

FIGS. 5, 6 and 7 show structural diagrams on how the more complex objects used in performing the expansion capabilities according to the present invention can be built by combining other objects. Objects having the same behavior may be implemented through a class hierarchy where the behavior from a base class is used by an object in a derived class or the object itself may be defined for implementing all of its behavior. The objects are described below as though they implement all of their behavior irrespective of whether a particular behavior was originally implemented through a class hierarchy. One having ordinary skill in object oriented programming languages will be able to derive their own class hierarchy from the description of the objects.

SYSTEM OBJECTS

FrontPanel

The single instance of this class maintains a list of Button and Knob objects (one for each occurrence on the front panel interface 36), a FPIntrBuffer queue for pending front panel events (queued up by the user interface 36 interrupt handler), and a pointer to a process to be signaled when the front panel interface 36 SysEventRec is ready for consumption. This process is the SystemController process object. This object is also responsible for reading from and writing to front panel interface hardware status and control registers.

FPIntrBuffer

An instance of this class acts as a queue which stores information regarding the cause of a front panel interrupt. The information stored includes the type of interrupt (e.g. button down, or knob turned), and which button or knob generated the interrupt.

Button

For each front panel button there is an instance of this class which maintains the button's status. This status includes the type of button (e.g. whether to report when the button is pressed, or report when the button is pressed and again after it has been held for a length of time, or report when it is pressed and again when it is released, etc.), and the state of the button (e.g. down, up, being held, etc.).

Knob

For each front panel knob there is an instance of this class which maintains the knob's status. The status includes the type of knob (one that reports when it is turned or one that also reports after it has been idle for a length of time), acceleration to be used for the knob (a list of multipliers to be used based on the time between interrupts for that knob), and the state of the knob (how many clicks the knob has turned since the last time a system event was generated for the knob).

SysEventRec

Each instance of this class represents a system event. One of its members indicates the type of the event. These events may represent such things as BUTTON-DOWN, BUTTON-UP, BUTTON-HELD, BUTTON-REPEAT, KNOB-TURNED, KNOB-IDLE, among others. For the case of a button or knob event another member indicates which button or knob is involved, and for knob events there is a member which indicates how far the knob is turned (positive is clockwise).

SystemController

The one instance of this class is the central controller for dispatching events to the appropriate objects. These events are most commonly front panel events, but can be other events sent from other processes such as acquisition events when acquired waveforms are ready for processing and display. It maintains a list of pointers to the major modes in the system of which the MeasMode object is one.

MeasMode

The one instance of this class is the main controller for the measurement subsystem of the OTDR software. It creates and maintains a DisplayableWaveform and WaveformDisplay object pair for both current and reference waveforms. When an acquisition is being performed, the newly acquired data is stored in the current waveform. The reference waveform represents a waveform previously acquired. It creates a SubView object which specifies the region of the display area 50 in which the waveforms 52 and 52A, the cursors 60 and 62 and expansion window 70 are to be displayed. It also creates and maintains the objects which are responsible for performing and displaying the different types of measurements which are performed on the OTDR data. It catches and interprets the system events (SysEventRec) which are passed down from the SystemController and which effect the cursors, view ports, and waveforms.

DisplayableWaveform

There is an instance of this class for both the current and reference waveforms. Each instance contains two MeasuredWaveform objects; one for normal density data and one for high density data. It also contains four ViewPort objects; one for the clipping viewport 82, one for the overview viewport 84, one for the expansion viewport 86, and one to keep track of the normal density expansion when viewing high density data (this is necessary when selecting between a cursor that is on high density data and one that is on normal density data). And it contains two CursorModel objects; one for each cursor 60 and 62 in the display area 50. This object also has the responsibility of coordinating the behaviors of its members. For example, it knows that if the active cursor is scrolled out of the display area 50, then the active viewport must be moved to enclose the active cursor again, or that if the expansion goes to the limit of normal density data, then the high density data needs to be displayed (if it is available).

MeasuredWaveform

There is an instance of this class for each data set stored in the OTDR (e.g. the high density data for the current waveform is represented by an instance of this class). It stores waveform scaling information as well as information regarding the acquisition used to acquire its data (pulse width settings, etc.). The scaling indicates the waveform horizontal location in world coordinates. Its information includes an offset (stored as a number of WFM_X_UNITS) which is the distance at the first data point in the waveform data set, and a scale in WFM_X_UNITS, which represents the distance between data points in the waveform data set, along with the size of the waveform data set. Each data sample represents an amplitude in WFM_Y_UNITS. In the preferred embodiment a WFM_X_UNIT is 0.5 mm in world coordinates and represents the minimum distance resolution possible for the OTDR. A WFM_Y_UNIT represents the minimum amplitude resolution possible in the OTDR in world coordinates, which is based on the output of the acquisition hardware. In the preferred embodiment there are approximately 573 WFM_Y_UNITS per dB.

ViewPort

Each instance of this class represents an area in world coordinates. The minimum and maximum distance (left and right boundaries) are stored in terms of WFM_X_UNITS, and the minimum and maximum amplitude (the top and bottom boundaries) are stored in terms of WFM_Y_UNITS. This object also has member functions which define behaviors such as centering the viewport vertically or horizontally around a given amplitude or distance, changing the height or width of the viewport such that a given amplitude or distance maintains its relative position within the area defined by the viewport (e.g. the width is enlarged by adjusting the min and max distances such that a given distance ends up the same 27% from the left edge as it started from), and shifting the viewport enough in the vertical or horizontal direction so that a given amplitude or distance will fall within the boundaries of the viewport.

CursorModel

Each instance of this class represents one of the cursors seen on the display. The cursors use a distance member to represent the distance (in WFM_X_UNITS) where the cursor lies in the horizontal dimension, and an amplitude member to represent the amplitude of the waveform (in WFM_Y_UNITS) at the distance of the cursor (to avoid repeatedly looking up the amplitude in the waveform data set).

SubView

Each instance of this class maintains a list of display objects which are displayed together as a group and defines the area in which that group of objects is to be displayed through the use of a DpyOwner object.

WaveformDisplay

An instance of this class exists for the current and any reference waveforms. It maintains a DpyWfrmObj, two DpyCursorObjs (one for each cursor), and a DpyExpWindObj which are the shared memory representations used in displaying the waveform. It is notified when a change occurs in its companion DisplayableWaveform object (or its members) and then makes sure that its member objects are up to date with those of the DisplayableWaveform object.

DpyCursorObj

Each instance of this class represents a cursor in the display area 50. This object differs from a CursorModel object in that it resides in shared memory (i.e. it can be accessed by the display controller 40) and holds the cursor information in a form that can be interpreted by the display controller 40. One of its members points to the DpyWfrmObj on which the cursor is to be displayed. Its location is specified by giving its location on the waveform as a data point index (the display does mapping between data points and pixels in the process of displaying the waveform related objects).

DpyWfrmObj

Each instance of this class represents a waveform data set. This object differs from a MeasuredWaveform object in that it does not contain some of the measurement and acquisition information stored in the MeasuredWaveform object and contains a pointer that points to the data array of the MeasuredWaveform object. The DpyWfrmObj also contains additional scaling information used by the display controller 40 to determine which portion of the waveform object is to be displayed within the waveform area in the display area 50 of the display device 38. Each instance of this object includes members which specify where the object is to be displayed within its SubView as the location of the upper left corner and its width and height (in pixels) relative to the location of the SubView's upper left corner. The scaling of the waveform is then determined according to members which specify the data point indexes which correspond to (or are to "line up with") the left and right edges of the waveform object boundary. Another member stores the size of the data set so that only legal indexes are used in accessing and displaying the data set values. The vertical dimension is similarly scaled via members which specify the amplitudes (in WFM_Y_UNITS) which correspond to the top and bottom of the waveform object boundary.

DpyExpWindObj

Each instance of this class represents an expansion window 70 on the display. This object differs from a ViewPort object in that it resides in shared memory and holds its boundary information in a form that can be interpreted by the display controller 40. One of its members points to the DpyWfrmObj on which it is to be displayed. Other members specify where its center point is located on the waveform (a data points index and an amplitude in WFM_Y_UNITS), and its width and height (in data points and WFM_Y_UNITS).

DpyOwner

Each instance of this class maintains a list of pointers to display objects which are displayed together as a group. The display objects in the DpyOwner specify their position relative to that of the DpyOwner. In addition the DpyOwner can also be used to specify behavior common to all objects in the group (i.e. colors).

DpyList

The one instance of this class maintains a list of pointers to all visible DpyOwner objects within the OTDR, and therefore points to all visible display objects (as each display object must belong to a DpyOwner). This list is passed to the display controller 40 whenever display commands are issued. In those instances where the entire list is not displayed, the list is used to check for overlapping objects. The members of this list are sorted according to their priority (the display controller 40 displays its members in order, so the lower priority objects are listed first).

GracieDev

The one instance of this class represents the display controller 40 to the instrument controller 34. The instrument controller 34 makes requests of this object to draw or erase display objects. This object then makes use of the Mailman object and MailMessage objects to carry out the request.

MailMan

The one instance of this class handles the low level communication between the instrument controller 34 and the display controller 40. It sends interrupts to the display controller 40 when display commands are issued, and responds to display controller interrupts when the display controller 40 has finished a requested display command.

MailMessage

Instances of this class are used to pass display commands to the display controller 40. There are two special instances (an in-box and an out-box) which represent the portion of shared memory dedicated to communication between the instrument controller 34 and the display controller 40. The members of this object are used to specify the DpyList, the type of display command to be performed (e.g. draw, erase, or some other special types), and the object on which to perform the display operation (for the cases where the entire display list is not being drawn). Other status information and the results of the display command are also stored in this object.

OBJECT COMMUNICATION

Figure 8:
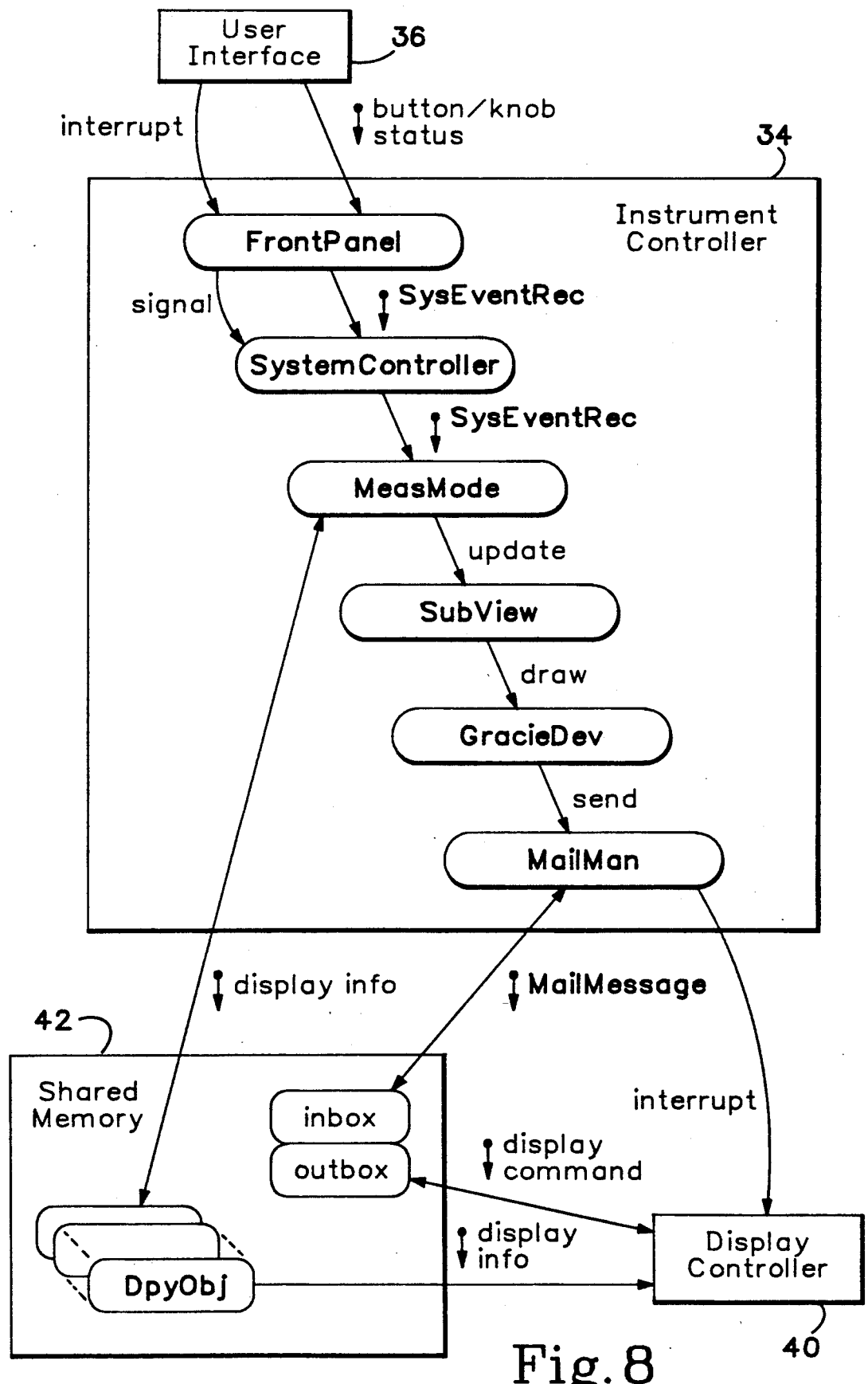
FIGS. 8-25 show how the software objects communicate with one another in response to a user interface event according to the system for expanding a waveform of the present invention.
Figure 9:
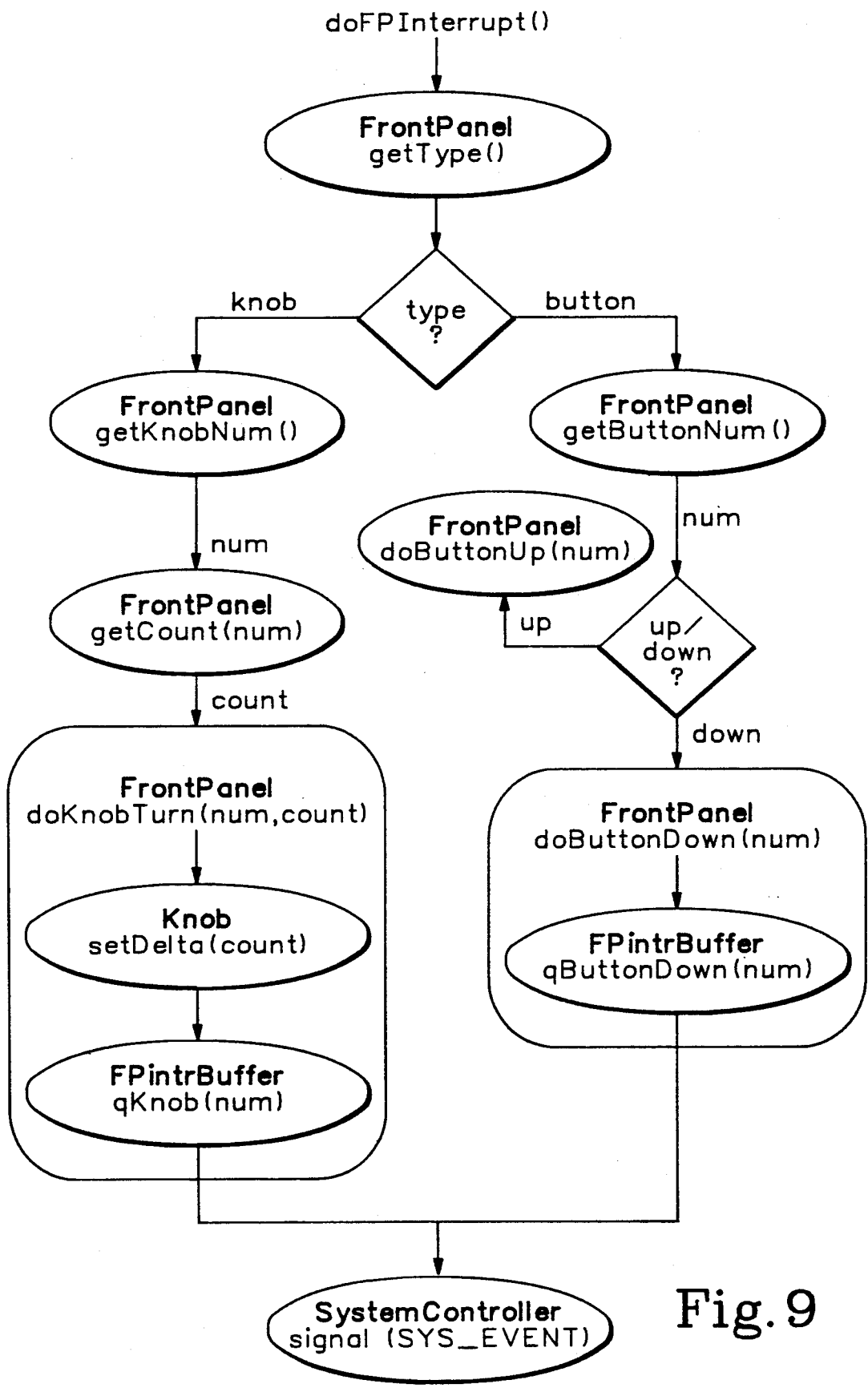

FIG. 8 is a representation of the relationship between the hardware elements and the communications between objects. The solid circles with arrows represent information being passed between objects or between objects and the display controller 40 and the arrows between objects represent messages from one object to another requesting that a task be performed. This figure in conjunction with the above described object behaviors and the accompanying description of the communications between objects associated with FIGS. 9-25 implement the expansion windowing system according to the present invention. The sequence of events shown in FIG. 9 occur within the context of the front panel interface interrupt handler. The routines getType( ), getKnobNum, getCount( ), and getButtonNum( ) read the front panel hardware and return the appropriate status information. The FrontPanel routine doKnobTurn( ) updates the knob count of the appropriate Knob object according to the new delta value from the front panel. The Knob's setDelta( ) routine also records the time of the event. Both this routine and the doButtonDown( ) routine queue up the occurrence of the event in the FPIntrBuffer object, and then sends a signal to the SystemController object causing its run( ) loop to stop waiting. The SystemController, which represents a separate process, responds to the signal by checking back to the FrontPanel object to see if there are any events pending.

Figure 10:
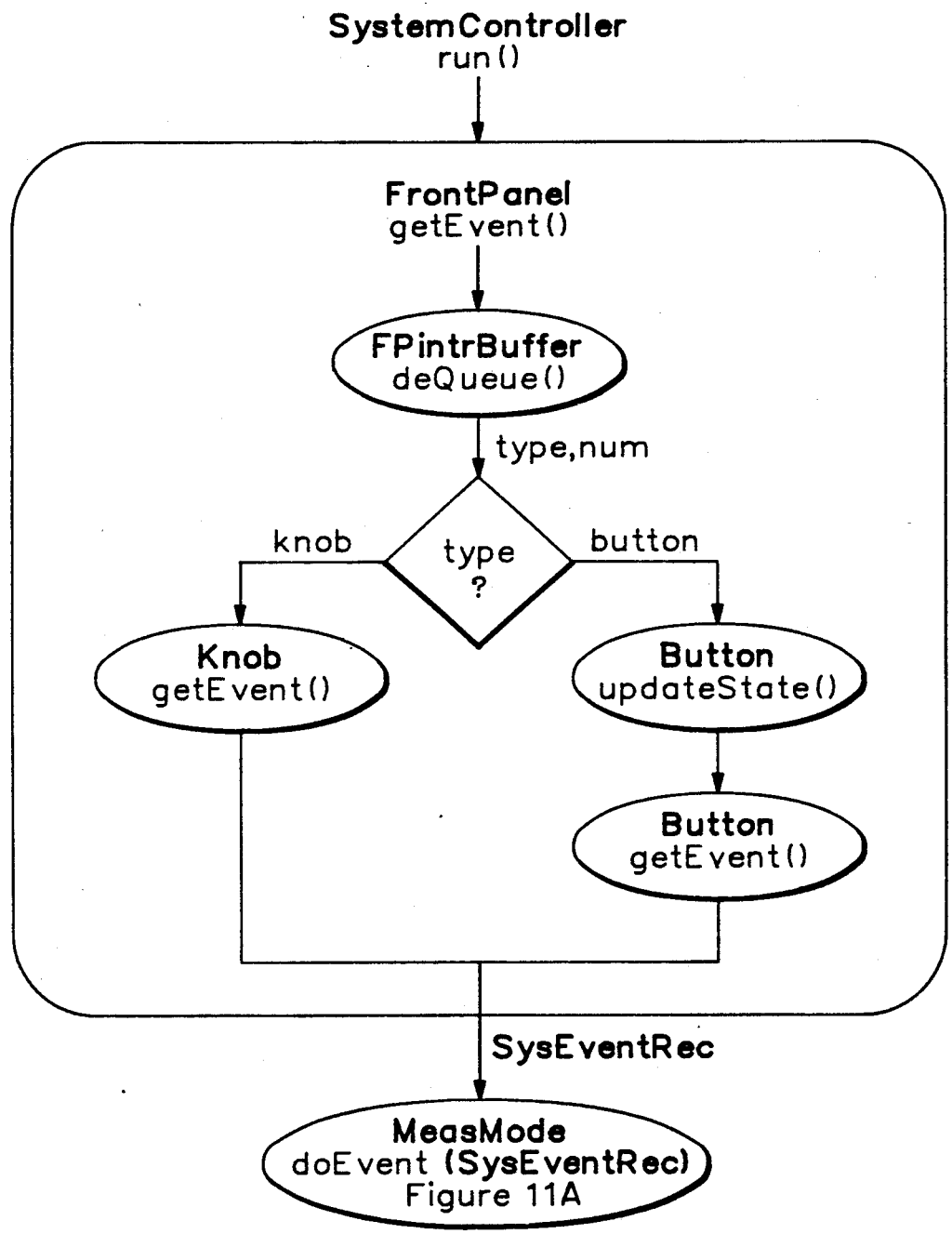

The sequence of events shown in FIG. 10 and subsequent figures relate to the update and display process, which occurs within the context of the SystemController process. As part of the normal processing loop, which runs continuously, or in response to a signal from the front panel interrupt handler, the FrontPanel object is poled for events. If an event exists in the FPIntrBuffer then it is removed and returned. If not, an event may be generated if it is determined that one of the knobs or buttons has changed state without an interrupt being generated. This occurs for such events as KNOW_IDLE, and BUTTON_HELD, which occur as a result of the passage of time. Depending on its type, a request to the appropriate Knob or Button object is made to generate a SysEventRec for the front panel event. In the case of a button event, the Button is first told to update its state, which includes recording the time of any event. Each Button object maintains its own state in software. The SystemController then passes the event to MeasMode object, which is one of several modes available in the OTDR.

Figure 11A:
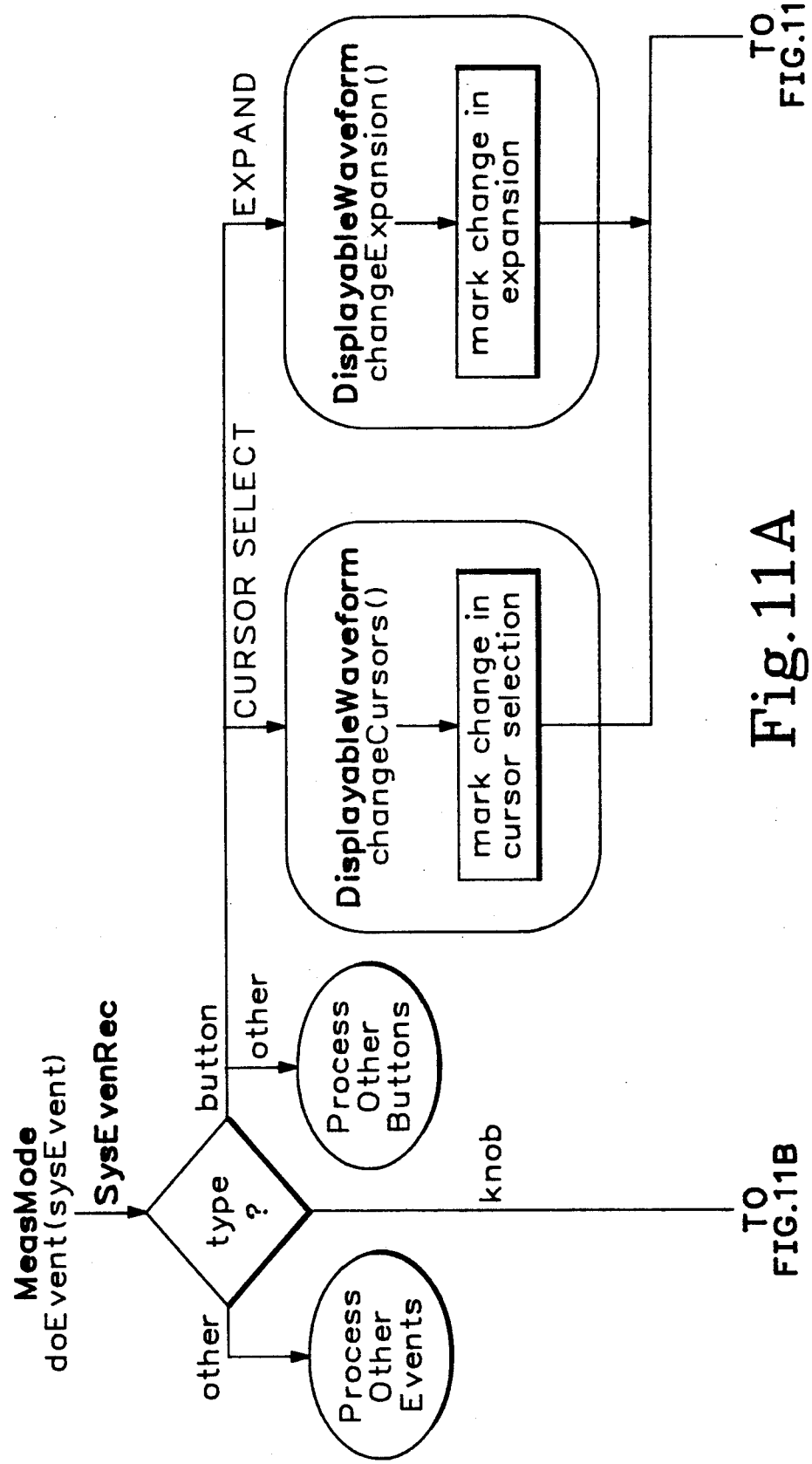
Figure 11B:
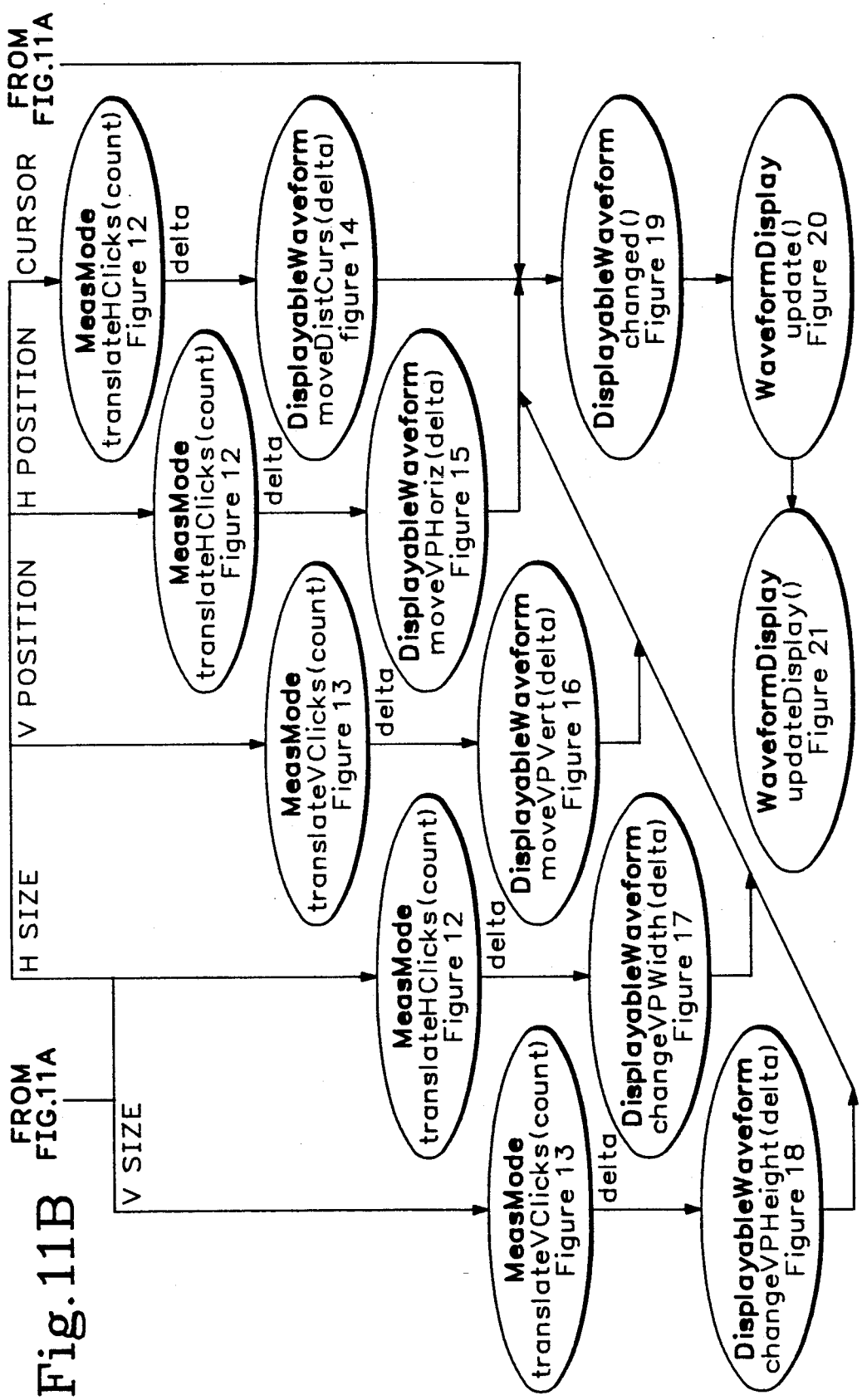

FIGS. 11A and 11B shows the response of MeasMode to the system event, which it identifies as being one of the buttons or knobs it is to respond to when it is active. Only the response to those buttons and knobs which affect how the active waveform is viewed are shown. These are the CURSOR SELECT and EXPAND buttons, 66 and 76, and the CURSOR CONTROL 64, HORIZONTAL WINDOW SIZE 72, VERTICAL WINDOW SIZE 76, WAVEFORM VERTICAL POSITION, and WAVEFORM HORIZONTAL POSITION knobs.

Figure 12:
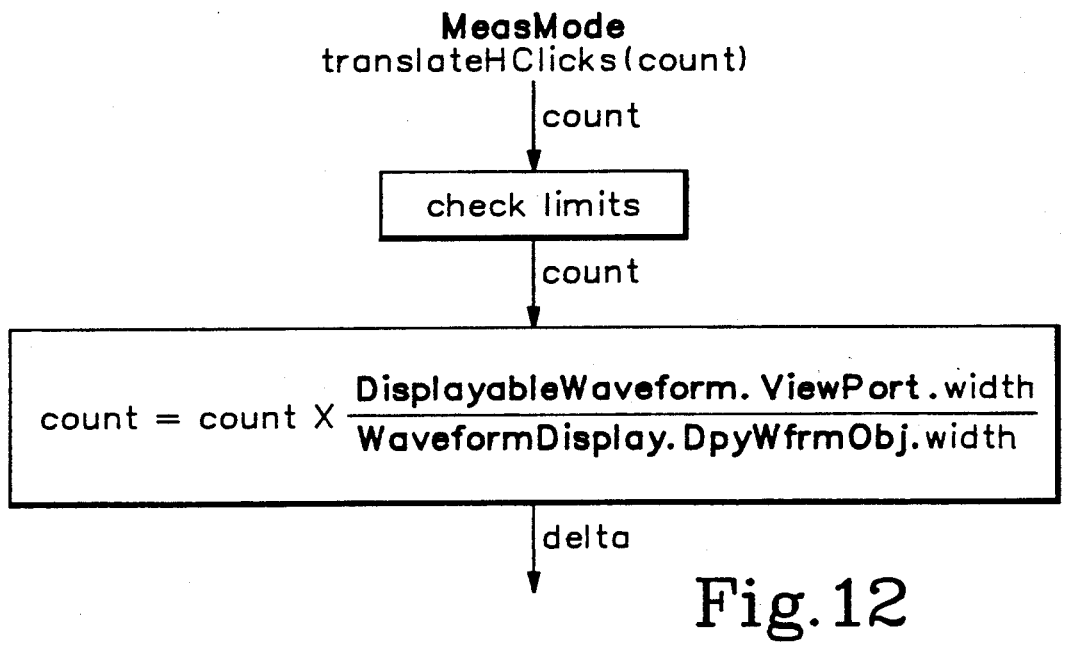
Figure 13:
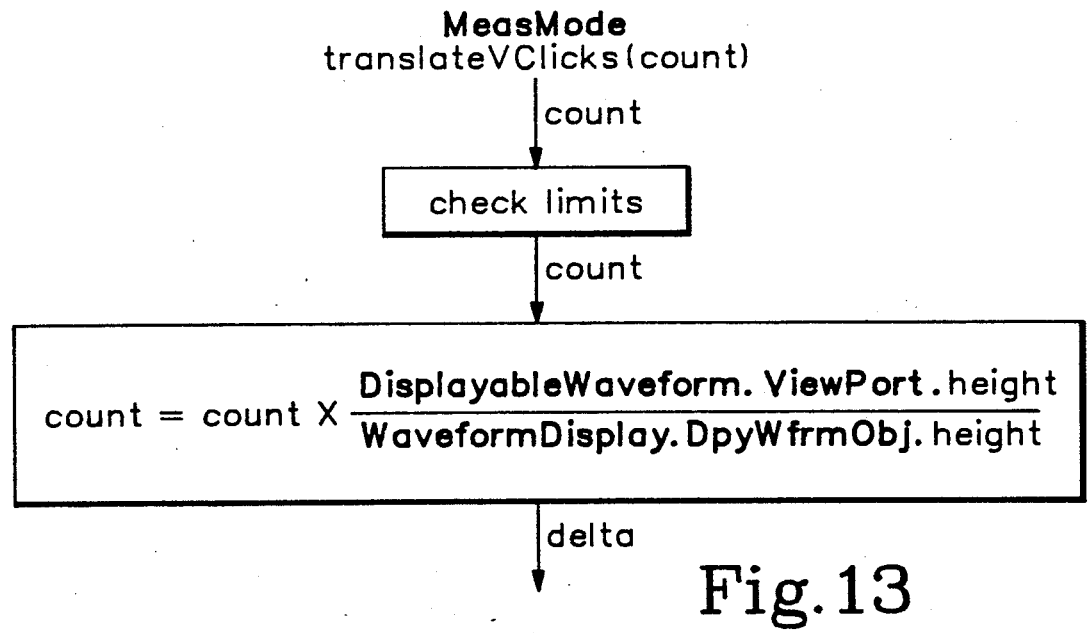
Figure 14:
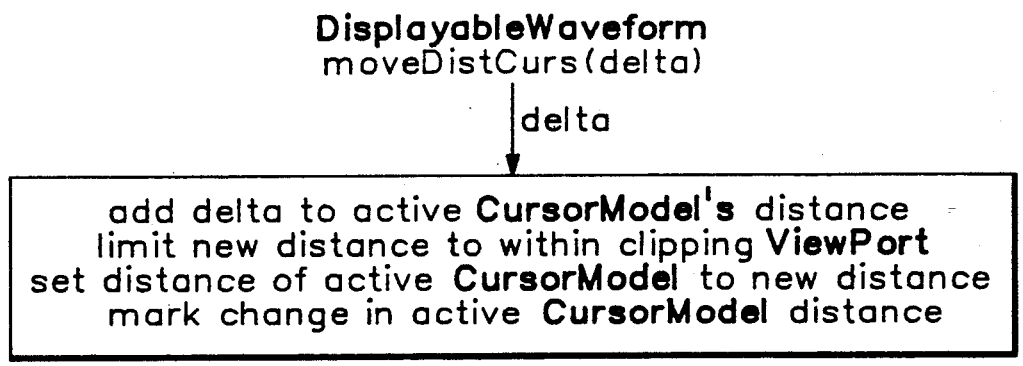

FIGS. 12 and 13 show how the count received from the knob is interpreted as a change in pixel units. Limits are checked to ensure that a small number of clicks result in at least one pixel move and that knob acceleration doesn't cause an ungainly jump on the part of the object being manipulated. The translation is done in the horizontal direction by comparing the current width in WFM_X_UNITS of the active ViewPort object with the width of the DpyWfrmObj, which defines the width in pixels of the display area in which the waveform is displayed. Which ViewPort object is active depends on the state of the instrument, i.e. the expanded viewport in the display area 50 or the overview viewport, etc. Likewise, the translation is done in the vertical direction by comparing the current height in WFM_Y_UNITS of the active Viewport object with height of the DpyWfrmObj, which defines the height in pixels of the display area in which the waveform is displayed.

Figure 15:
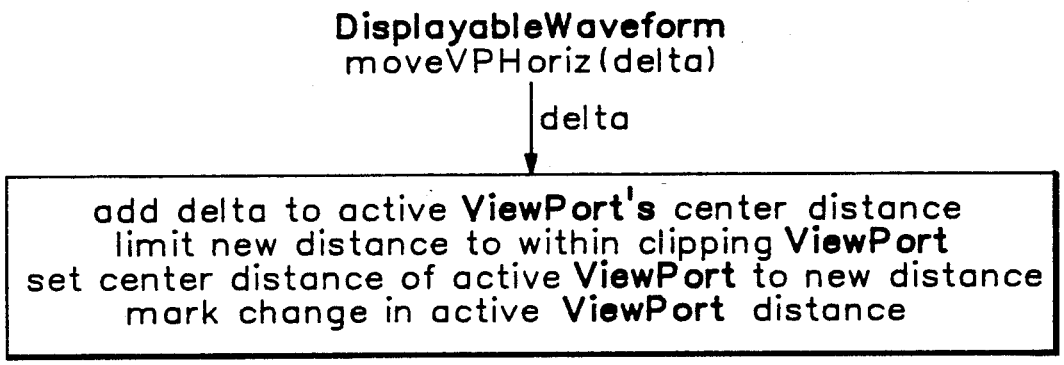
Figure 16:
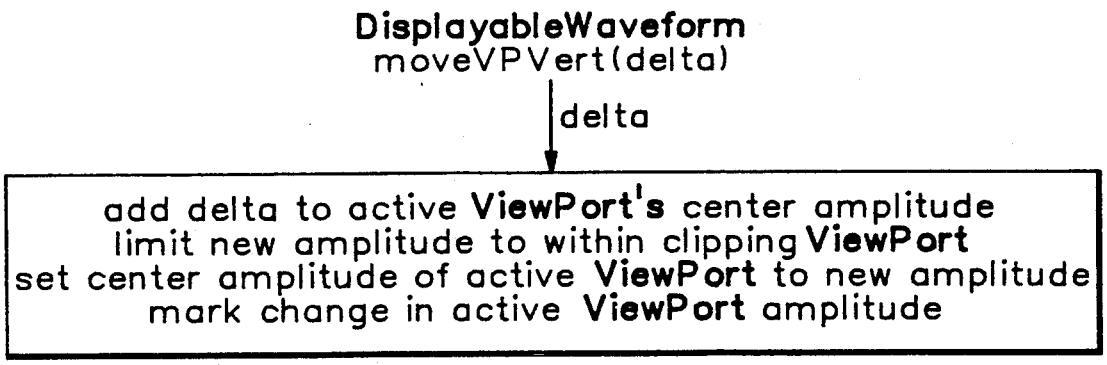
Figure 17:
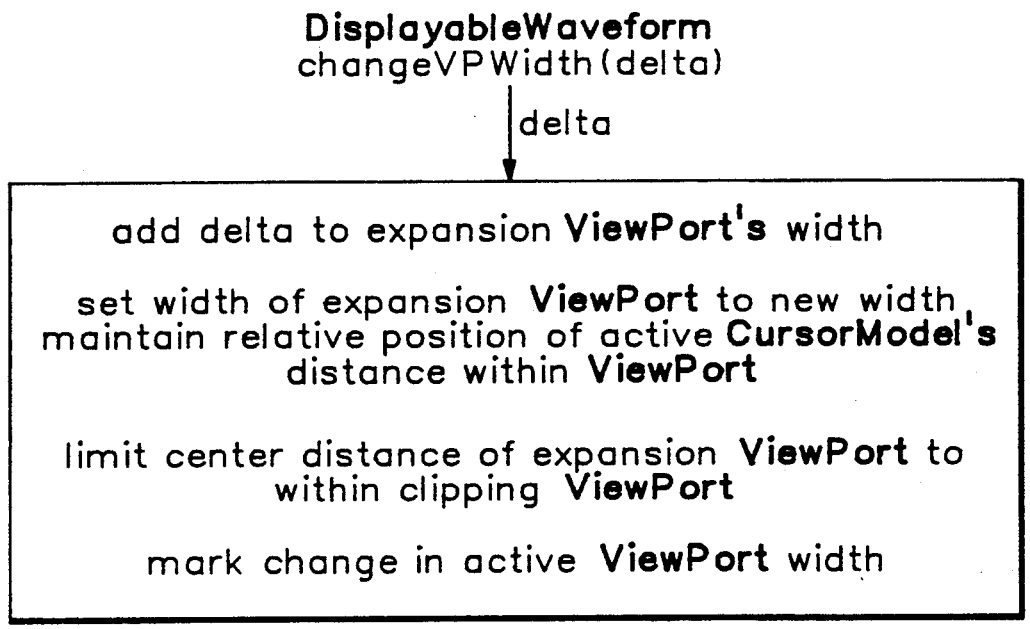
Figure 18:
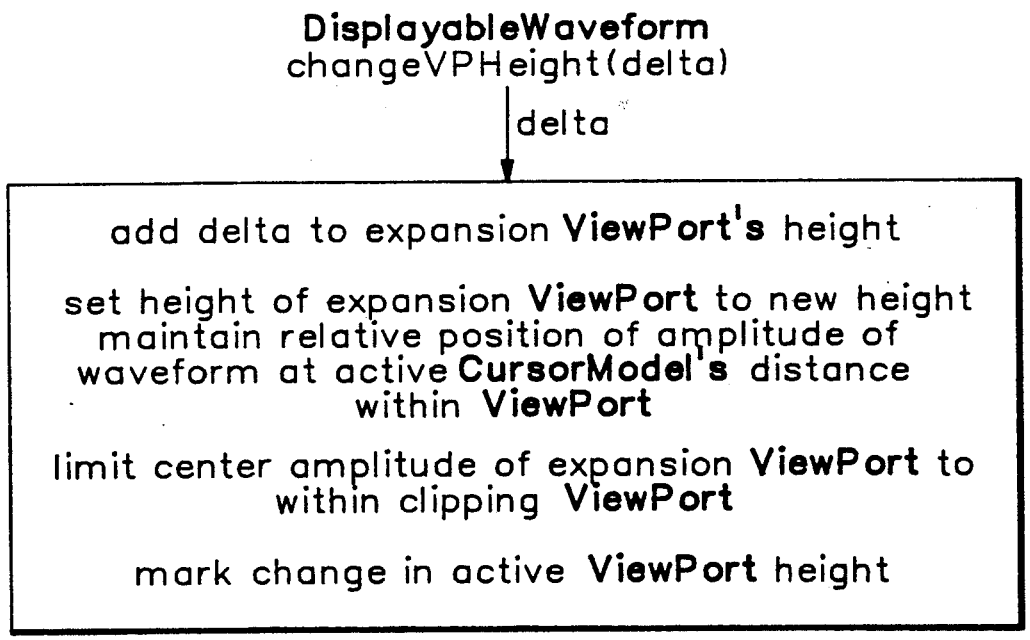
Figure 19:
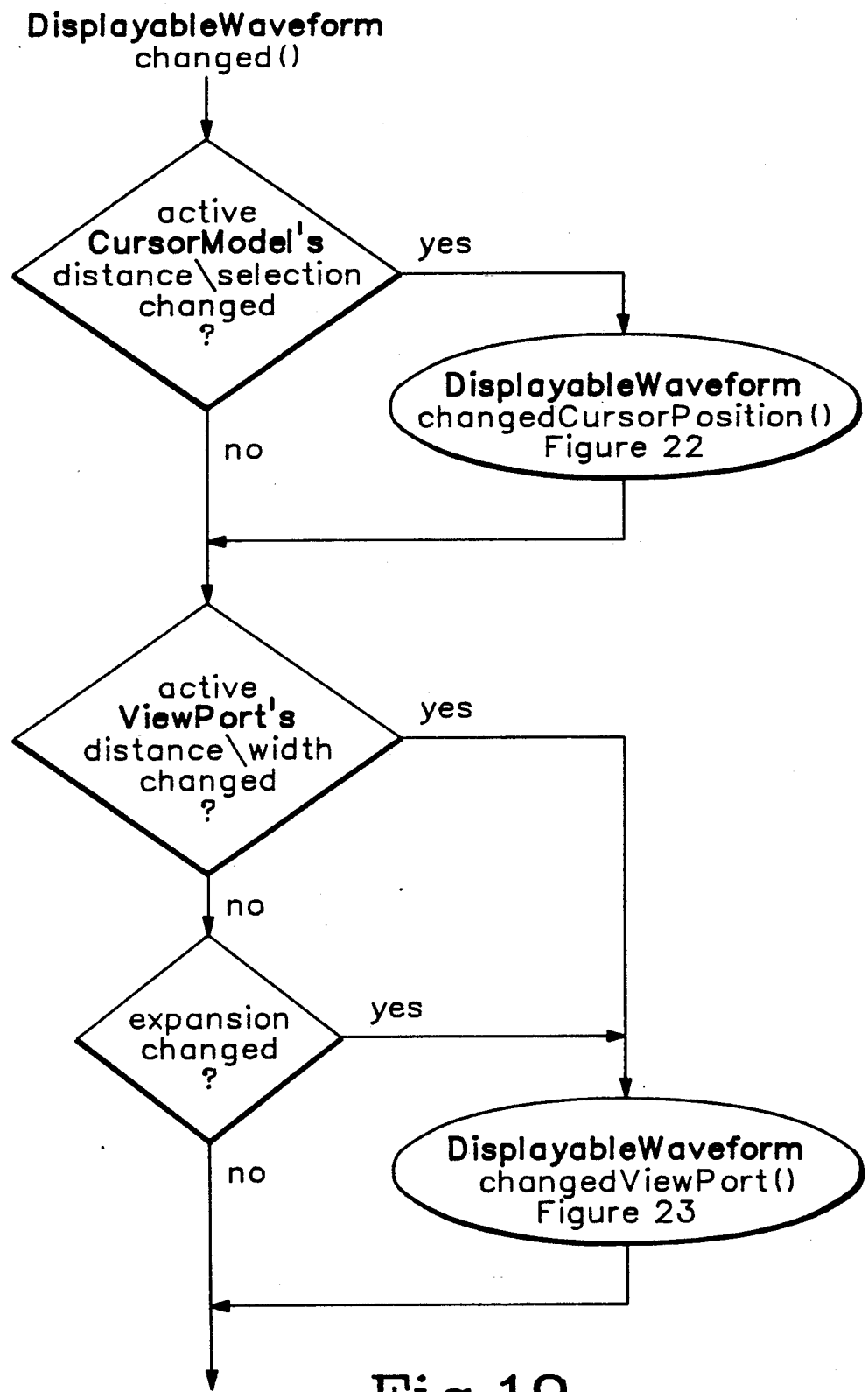
Figure 20:
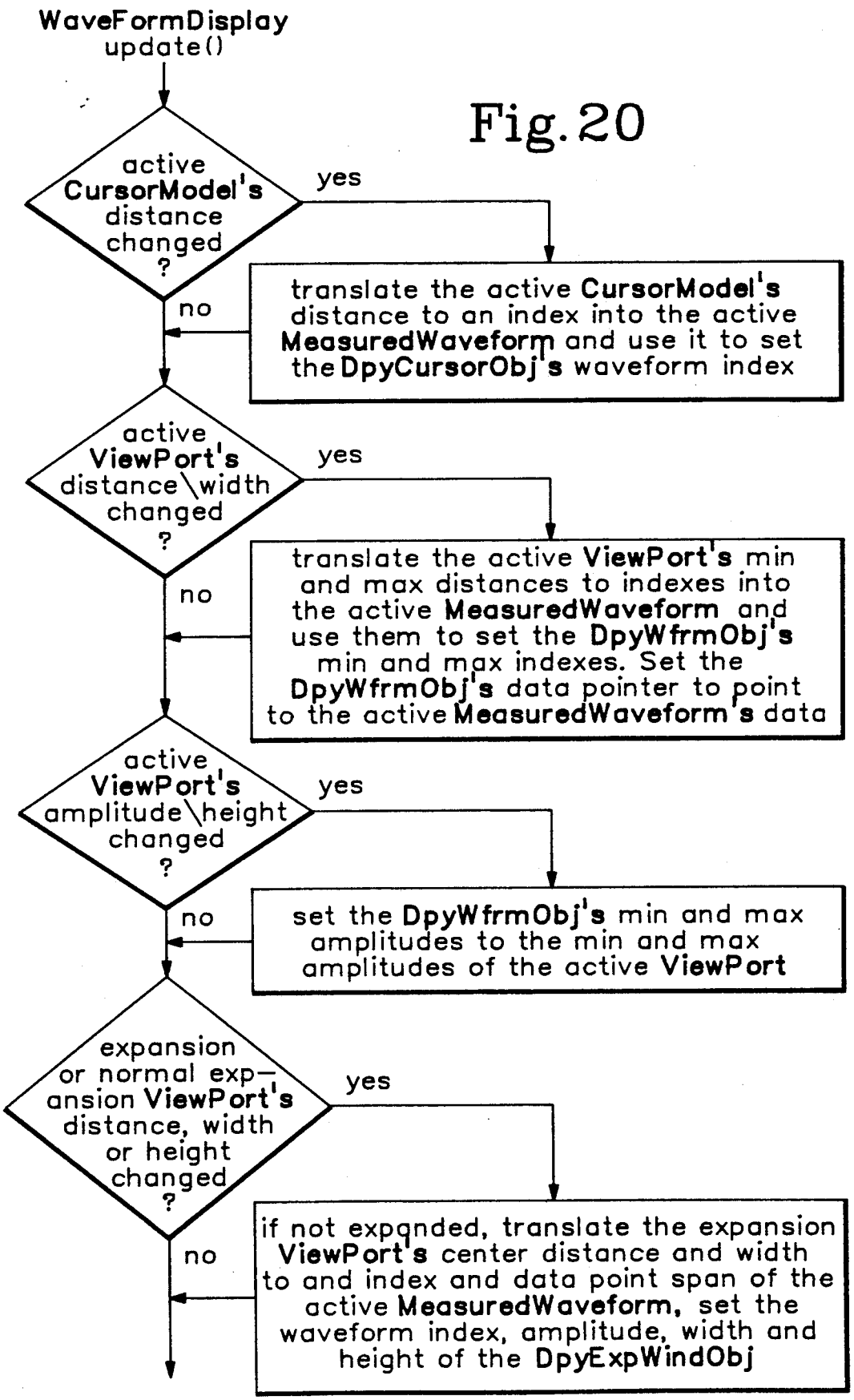

In FIGS. 14-18 the object directly affected by the front panel event is updated according to the event. For example, the active CursorModel's distance is changed in response to a CURSOR knob event. The change is marked so that later processing can make the appropriate response to the change, such as moving the active viewport object if the cursor is moved past its edge, or updating the display as is shown in FIGS. 19 and 20. In FIGS. 15 and 16 the center distance and center amplitude of the active Viewport are changed respectively in response to the WAVEFORM HORIZONTAL and VERTICAL POSITION knob events. The respective changes are marked so that later processing can make the appropriate response to the changes. In FIGS. 17 and 18 the width and the height of the expansion viewport are changed respectively in response to the HORIZONTAL and VERTICAL WINDOW SIZE knob events. Again, these changes are marked so that later processing can make the appropriate response to the changes.

After an object has been changed in response to a front panel event, the changes are checked for possible secondary effects on its companion objects. This is illustrated in FIG. 19, which shows responses to the active cursor being moved or switched with the non-active cursor, the active viewport being moved horizontally or, if in the expanded mode, its width changing, and the expansion switching between overview and expanded modes.

FIG. 20 shows how the shared memory object members of the WaveformDisplay object, the DpyObjs, are updated based on changes made to the DisplayableWaveform objects. The coordinate space of these display objects use the same world amplitude coordinates for its vertical dimension, but uses waveform indexes for its horizontal dimension. The use of waveform indexes simplifies positioning cursors and the expansion window relative to the position of the waveform. Setting these display objects involves translating the world coordinate distances to the index into the waveform with which the object (cursor or expansion window) is associated according to the following equation:

$$\text{index} = \frac{(\text{dist} - \text{offset})}{\text{scale}}$$

The amplitude of the cursor does not need to be set since the cursor is always a fixed height extending from the bottom of the waveform SubView to near the top.

Figure 21:
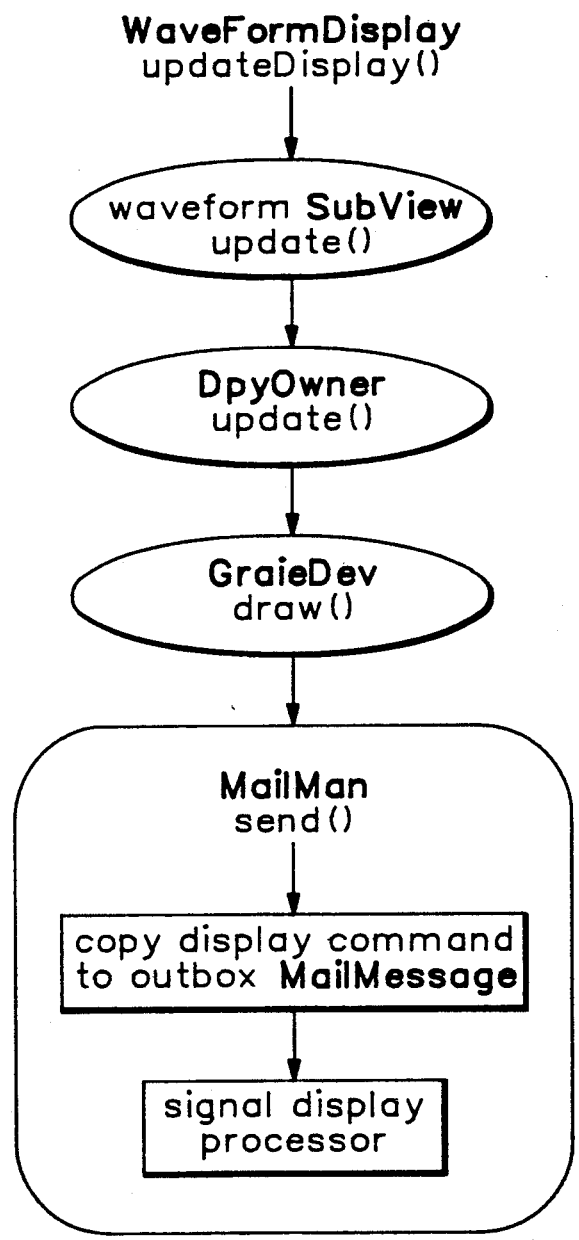

FIG. 21 shows the object communication which results in a display command being sent to the display controller 40. The command may represent the drawing or erasing of a single object, all objects in a DpyOwner's list (in a SubView), or all objects in the system (in the DpyList). The type of command depends on how the MailMan send( ) routine is called. In this case, it is called as a result of telling the waveform SubView object to update, so it is a command that draws the list of objects in a DpyOwner (the one that contains the waveform, expansion window and the distance cursors). A useful feature of the MailMan send( ) routine is that it can be told not to wait for the display controller 40 to finish processing the command before returning. This allows the instrument controller 34 to continue processing, say the next front panel event, while the display controller 40 is updating the display area 50. A null command, which does wait for the display controller 40 to complete its response to a command may be used when synchronization is necessary, for example before updating the contents of shared memory again.

Figure 22:
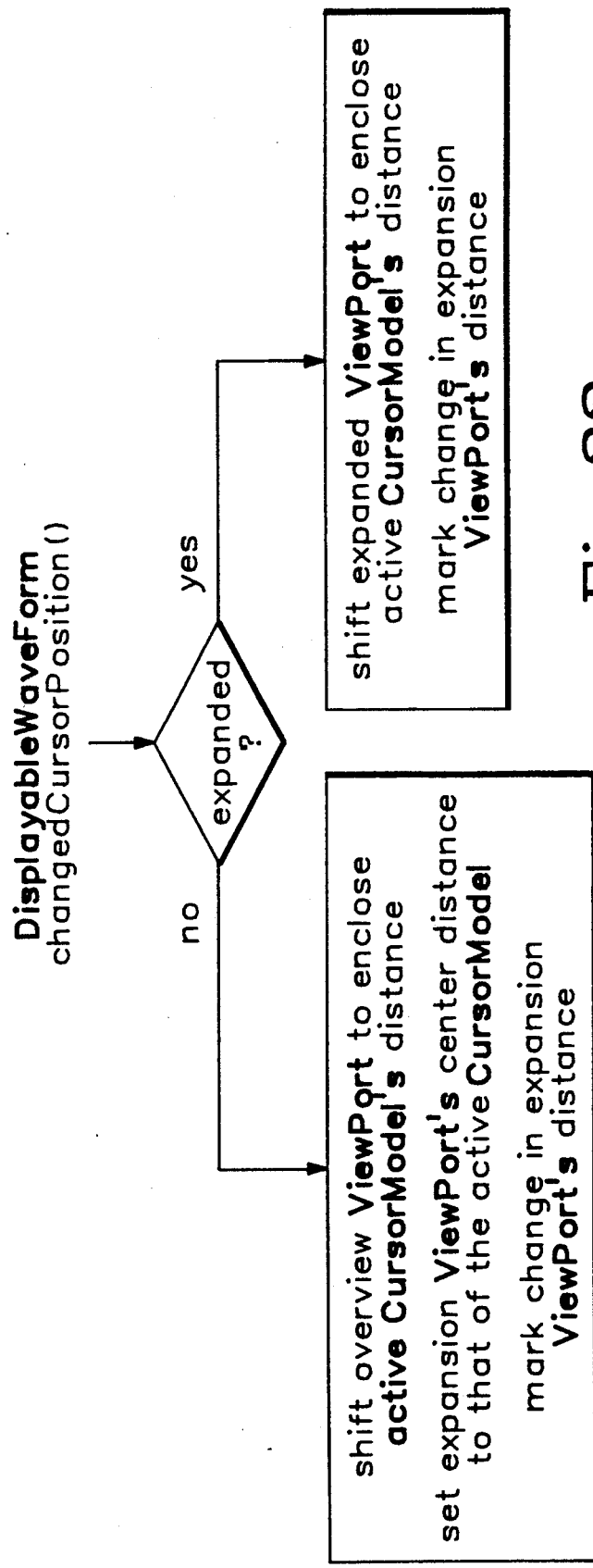
Figure 23:
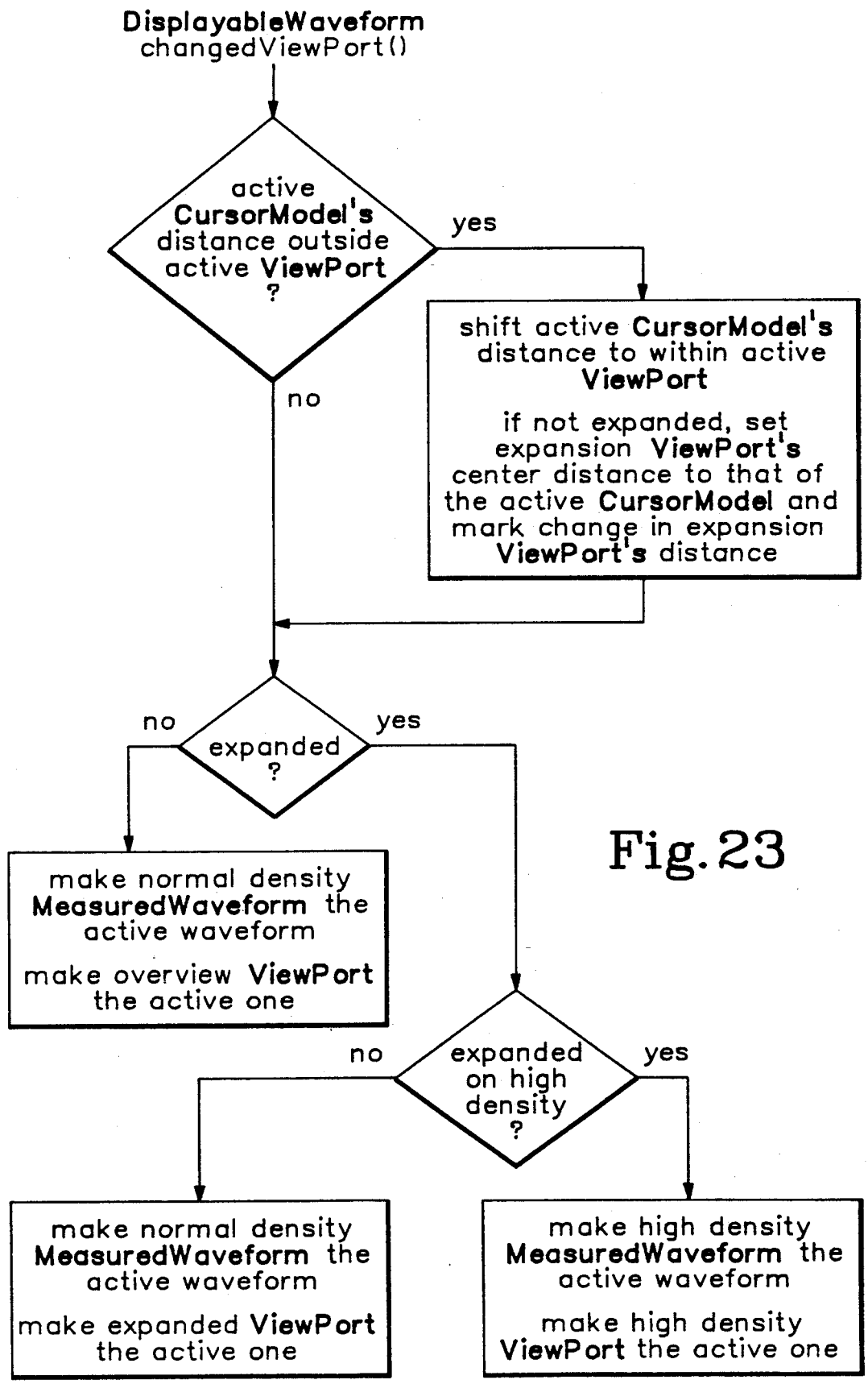

The ViewPort objects response to the cursor being moved or switched are shown in FIG. 22 and the effects of changes on the ViewPort objects are shown in FIG. 23. A different action is taken depending on whether the waveform is being viewed in expanded mode or overview mode. FIG. 23 also shows how the switch is made between viewing high density or normal density data. Recall that the WaveformDisplay update( ) routine (FIG. 20) sets up the DpyWfrmObj to point to the data in the active MeasuredWaveform object. If the waveform is expanded far enough to view high density data, i.e. if high density data exists, and if the expansion reaches the normal density limit, then the high density MeasuredWaveform is made active. If there is no high density data, then the normal density MeasuredWaveform remains the active one and the user is prompted to press the START/STOP button to acquire high density data.

Figure 24:
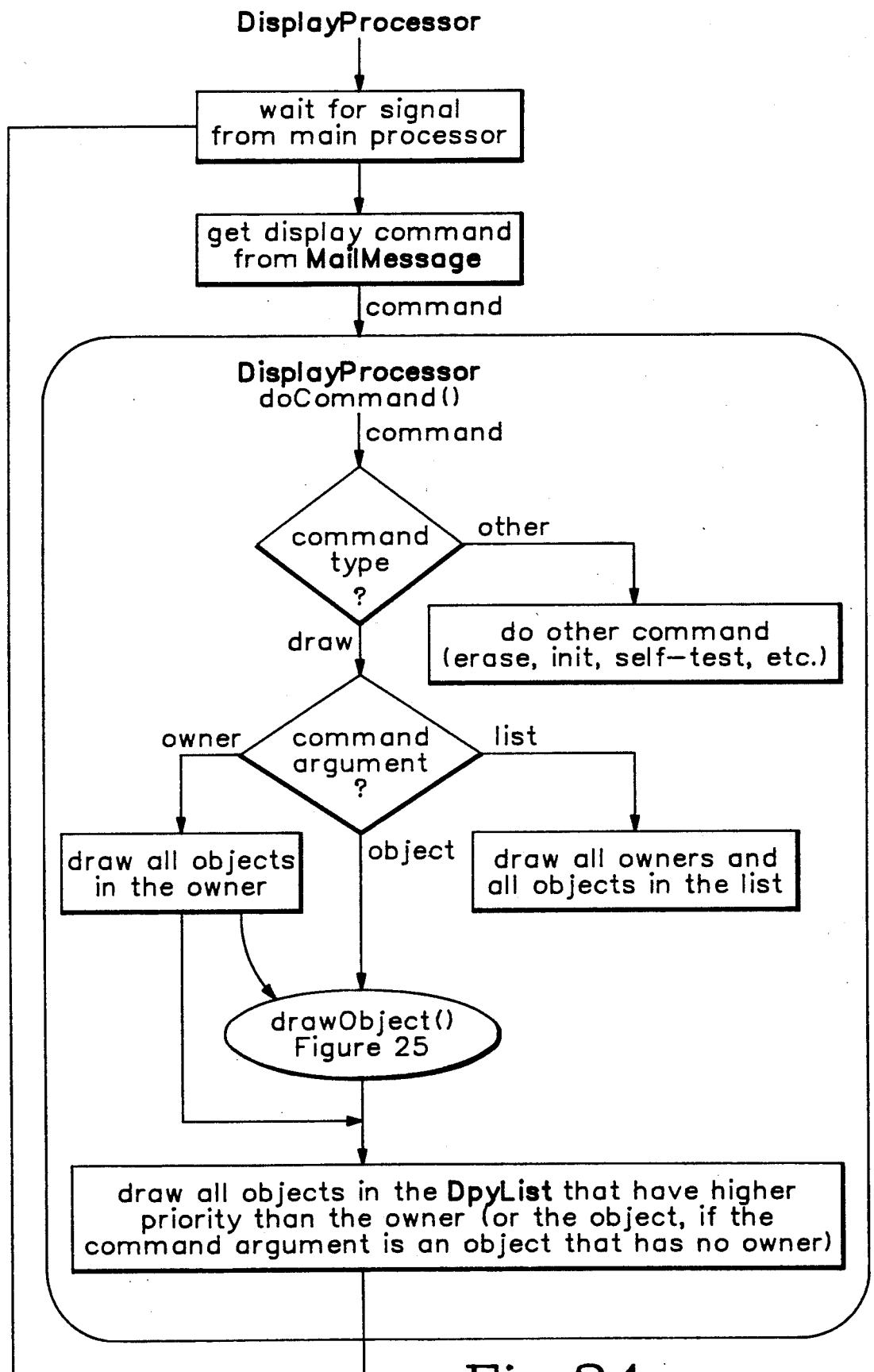
Figure 25:
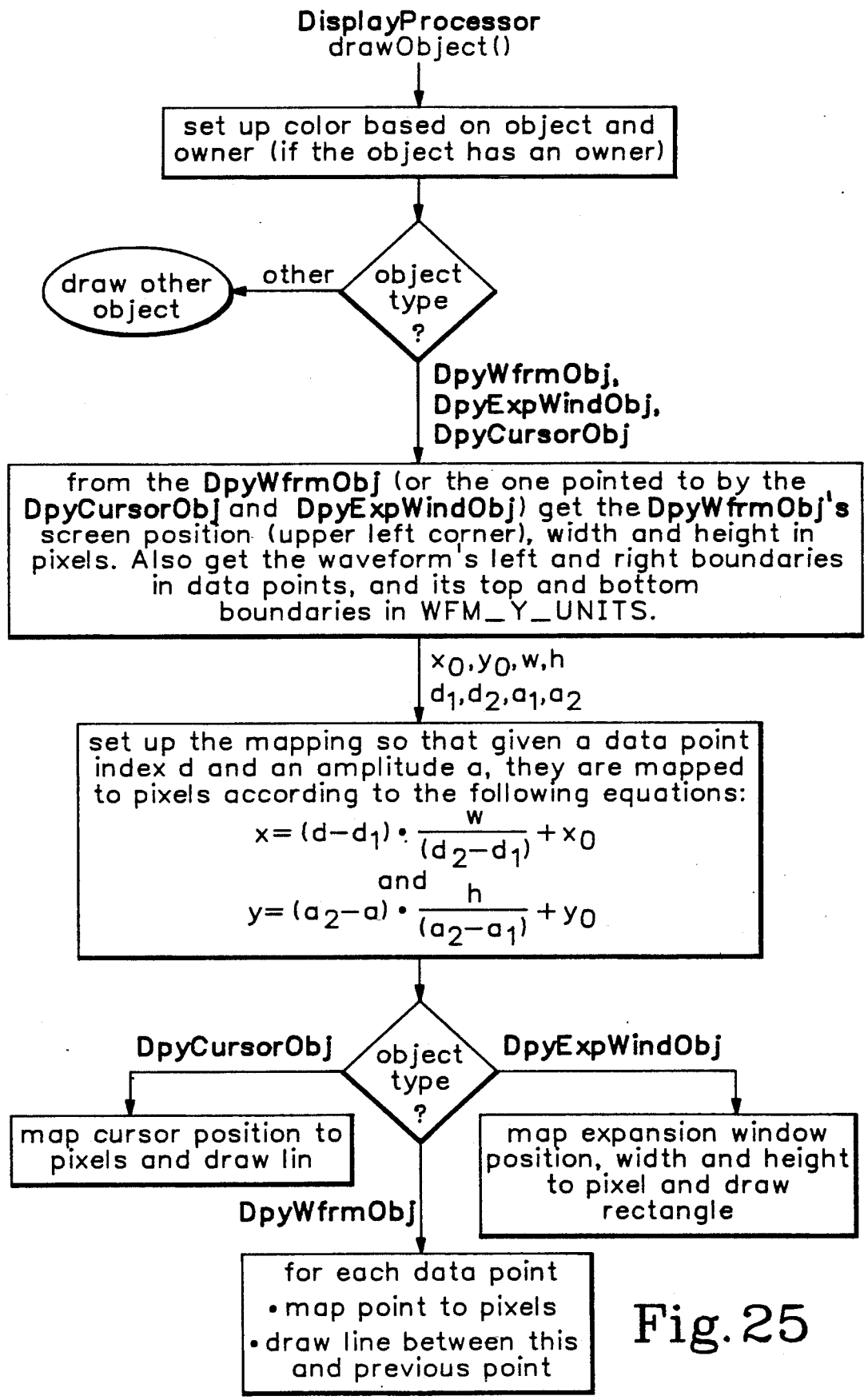

The main loop for the display controller 40 is shown in FIG. 24. When the instrument controller 34 signals the display controller 40 that there is a display command in the mailbox, the display controller 40 retrieves the command from the MailMessage left in the mailbox by the instrument controller 34. While the display controller 40 can carry out other commands like erase, initialize (restart), and various diagnostic procedures, the draw command is the one shown in the figure. It is used when objects need to be updated on the screen because they have changed in some way (position, color etc.). An object is drawn by drawing a list of which it is a member, which may be the DpyList of all objects in the system, by drawing an owner to which it is a member, or by drawing the objects individually. In the present invention, the waveform, expansion window and cursor object are drawn by drawing their common owner since they typically overlap and drawing one requires that the other be redrawn. An owner is drawn by drawing each of the objects in the list, as shown in FIG. 25. Once the owner is drawn, all other objects which overlap it are redrawn. This is done by traversing the DpyList, which is stored by priority, and drawing all objects and owners, which have higher priority than the owner that was specified in the draw command.

Figure 26:
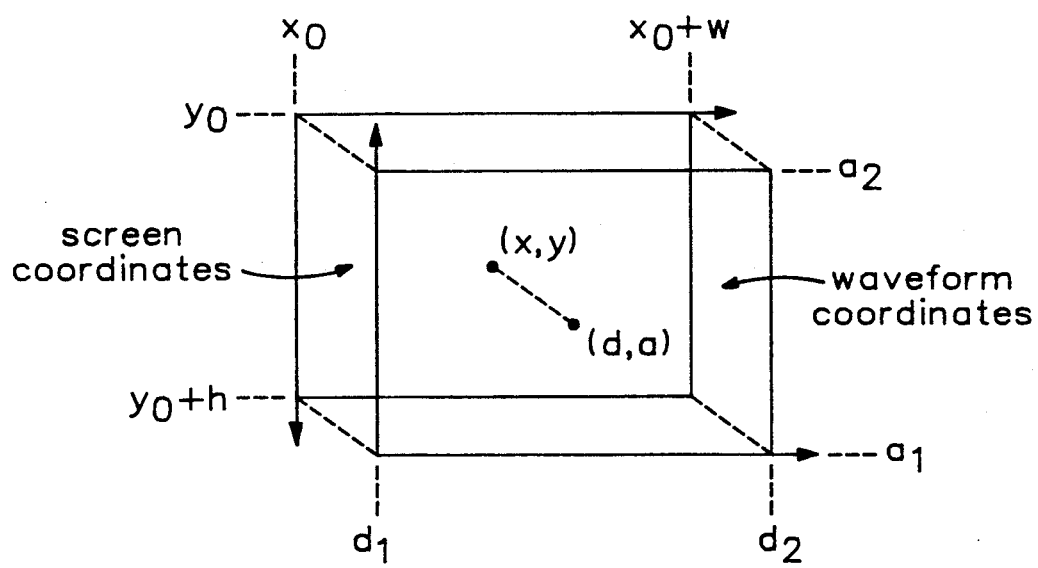
FIG. 26 shows the relationship between waveform coordinates and display coordinates in the system for expanding a waveform according to the present invention.

FIG. 25 shows how the expansion window, cursors and waveform are drawn. As with other objects, the color in which the object is drawn is set. Then the waveform coordinates (data points and WFM_Y_UNITS) and display area coordinates (pixels) used for mapping between the coordinate systems are retrieved. For the DpyCursorObj and DpyExpWindObj, the mapping is done according to DpyWfrmObj on which they are to be drawn. Recall that each DpyCursorObj and DpyExpWindObj has a pointer to a DpyWfrmObj. With these coordinate values, which specify the boundaries of a window in each coordinate system, a mapping function is initialized to map waveform coordinates to display area or screen coordinates. Notice that in the equation for the y pixel coordinate, the relative position (the quantity in square brackets) is calculated as a distance from the top of the waveform coordinate window, $a_2$. This is because the origin of the display area coordinate system used by the display controller 40 is in the upper left corner of the display area 50 with the positive direction of the vertical dimension going downward in the display area. FIG. 26 shows the relationship between the coordinate systems.

It will be appreciated that the invention is not restricted to the particular embodiment using the described objects exhibiting the above behaviors. Another set of objects may be used, which exhibit different individual behaviors but having their combined behaviors result in the system for expanding a waveform as set forth in the appended claims. In addition, other traditional programming languages, such as C, Pascal, assembly, and the like, may be used without departing from the scope of the invention as defined in the appended claims and equivalents thereof.

We claim:

1. A system for expanding a waveform in a display area having an active movable cursor intersecting the waveform with the waveform representative of data acquired by a measurement instrument comprising:
   a first viewport for displaying the waveform in the display area;
   a second viewport for displaying a portion of the waveform from the first viewport in an expanded form in the display area, the second viewport having a center point and dimensions defined in the first viewport with the center point being defined by the intersection of the cursor with the waveform and the dimensions being defined with respect to the center point, the second viewport being movable within the first viewport as a function of movement of the cursor;
   means for varying the dimensions of the second viewport about the intersection of the cursor with the waveform when the first viewport is in the display area and for further expanding the waveform in a continuous manner about the cursor when the second viewport is in the display area; and
   means for replacing the first viewport with the second viewport in the display area.

2. The system as recited in claim 1 further comprising:
   a non-active stationary cursor within the display area intersecting the waveform;
   means for making the non-active stationary cursor the active movable cursor and the active moveable cursor the non-active stationary cursor; and
   means for maintaining the second viewport on the active cursor.

3. In an optical time domain reflectometer displaying waveform data representative of return reflected light from a fiber under test in a bit-mapped display area having an active movable cursor intersecting the waveform data, a system for expanding the waveform data in the bit-mapped display area comprising:
   a first viewport for displaying the waveform data in the bit-mapped display area;
   a second viewport for displaying a portion of the waveform data from the first viewport in an expanded form in the bit-mapped display area, the second viewport having a center point and dimensions defined in the first viewport with the center point being defined by the intersection of the cursor with the waveform data and the dimensions being defined with respect to the center point, the second viewport being movable within the first viewport as a function of movement of the cursor;
   means for varying the dimensions of the second viewport about the intersection of the cursor with the waveform when the first viewport is in the bit-mapped display area and for further expanding the waveform in a continuous manner about the cursor when the second viewport is in the bit-mapped display area; and means for replacing the first viewport with the second viewport in the bit-mapped display area.

4. The system as recited in claim 3 further comprising:

a non-active stationary cursor within the bit-mapped display area intersecting the waveform;

means for making the non-active stationary cursor the active movable cursor and the active moveable cursor the non-active stationary cursor; and means for maintaining the second viewport on the active cursor.

5. A method of expanding a waveform in a display area having an active movable cursor intersecting the waveform with the waveform representative of data acquired by a measurement instrument, the steps comprising:

displaying the waveform in a first viewport defined by the display area;

defining a second viewport within the first viewport, the second viewport having a center point being defined by the intersection of the cursor with the waveform and the dimensions being defined with respect to the center point;

moving the second viewport within the first viewport as a function of the movement of the cursor;

varying the dimensions of the second viewport about the intersection of the cursor with the waveform;

replacing the first viewport with the second viewport in the display area to display the waveform defined by the second viewport in an expanded form; and expanding the waveform in a continuous manner about the cursor in the display area defined by the second viewport.

6. The waveform expanding method as recited in claim 5 further comprising the steps of:

defining a non-active stationary cursor intersecting the waveform in the display area;

making the non-active stationary cursor the active movable cursor and the active movable cursor the non-active stationary cursor; and maintaining the second viewport on the active cursor.

* * * * *